United States Patent
Rutherford

(12) 
(10) Patent No.: US 7,808,451 B1
(45) Date of Patent: *Oct. 5, 2010

(54) ORGANIC ELECTROLUMINESCENT DISPLAY DEVICE METHOD AND APPARATUS

(75) Inventor: James C. Rutherford, Fort Wayne, IN (US)

(73) Assignee: Imaging Systems Technology, Inc., Toledo, OH (US)

( * ) Notice: Subject to any disclaimer, the term of this patent is extended or adjusted under 35 U.S.C. 154(b) by 1397 days.

This patent is subject to a terminal disclaimer.

(21) Appl. No.: 11/065,157

(22) Filed: Feb. 25, 2005

Related U.S. Application Data

(63) Continuation-in-part of application No. 10/277,500, filed on Oct. 22, 2002, now Pat. No. 6,861,810.

(60) Provisional application No. 60/335,216, filed on Oct. 23, 2001.

(51) Int. Cl.
G09G 3/12 (2006.01)
G09G 3/10 (2006.01)

(52) U.S. Cl. .............................. 345/45; 345/46; 345/76; 315/169.3

(58) Field of Classification Search .................. 345/36, 345/45, 55, 76, 204, 212, 46; 315/169.3; 362/84, 800; 313/505
See application file for complete search history.

(56) References Cited

U.S. PATENT DOCUMENTS

| 5,828,181 | A | * | 10/1998 | Okuda | 315/169.3 |
| 6,084,579 | A | * | 7/2000 | Hirano | 345/205 |
| 6,861,810 | B2 | * | 3/2005 | Rutherford | 315/169.3 |
| 2001/0001050 | A1 | * | 5/2001 | Miyashita et al. | 428/690 |
| 2001/0054711 | A1 | * | 12/2001 | Numao | 257/72 |

* cited by examiner

Primary Examiner—Srilakshmi K Kumar
(74) Attorney, Agent, or Firm—Donald K. Wedding

(57) ABSTRACT

An organic electroluminescent display device connected by a blocking diode in series to an organic light-emitting diode (OLED). Each pixel or subpixel of the electroluminescent display device comprises an OLED, a blocking diode to prevent the OLED from being reversed biased, a rectification diode to isolate the column electrode from unselected rows and a capacitor as a memory device. The charge stored in each memory capacitor may be increased by the blocking diode in series with each OLED. A frame period of the display device is divided into sub-frames that have address and light emission periods. Current mode data programming is used to address the device in each sub-frame. A ramp waveform is applied to the row electrode during the light emission period, to cause the capacitor to discharge through the OLED and control the forward current level.

8 Claims, 23 Drawing Sheets

CATHODE FRONT CIRCUIT DIAGRAM
with BLOCKING DIODE IN SERIES TO OLED

4 TRANSISTOR PIXEL DRIVER

**CIRCUIT AND WAVEFORM
CATHODE FRONT**

CIRCUIT AND WAVEFORM ANODE FRONT

Circuit with Current Limit and Waveforms Cathode Front

Circuit with Current Limit and Waveforms Anode Front

EIGHT SUB-FRAMES

Examples of gray scale combinations

| Frame | Sub-Frame | X | Pulse Width Modulation | = | Binary Weight | Gray Scale Level |
|---|---|---|---|---|---|---|
| 1 | 6<br>2 |  | 31<br>32 |  | 186<br>64 | 250 |
| 2 | 6<br>2 |  | 17<br>18 |  | 102<br>36 | 138 |
| 3 | 7<br>1 |  | 7<br>8 |  | 49<br>8 | 57 |

OLED FRONT SUB-PIXEL PERCENT

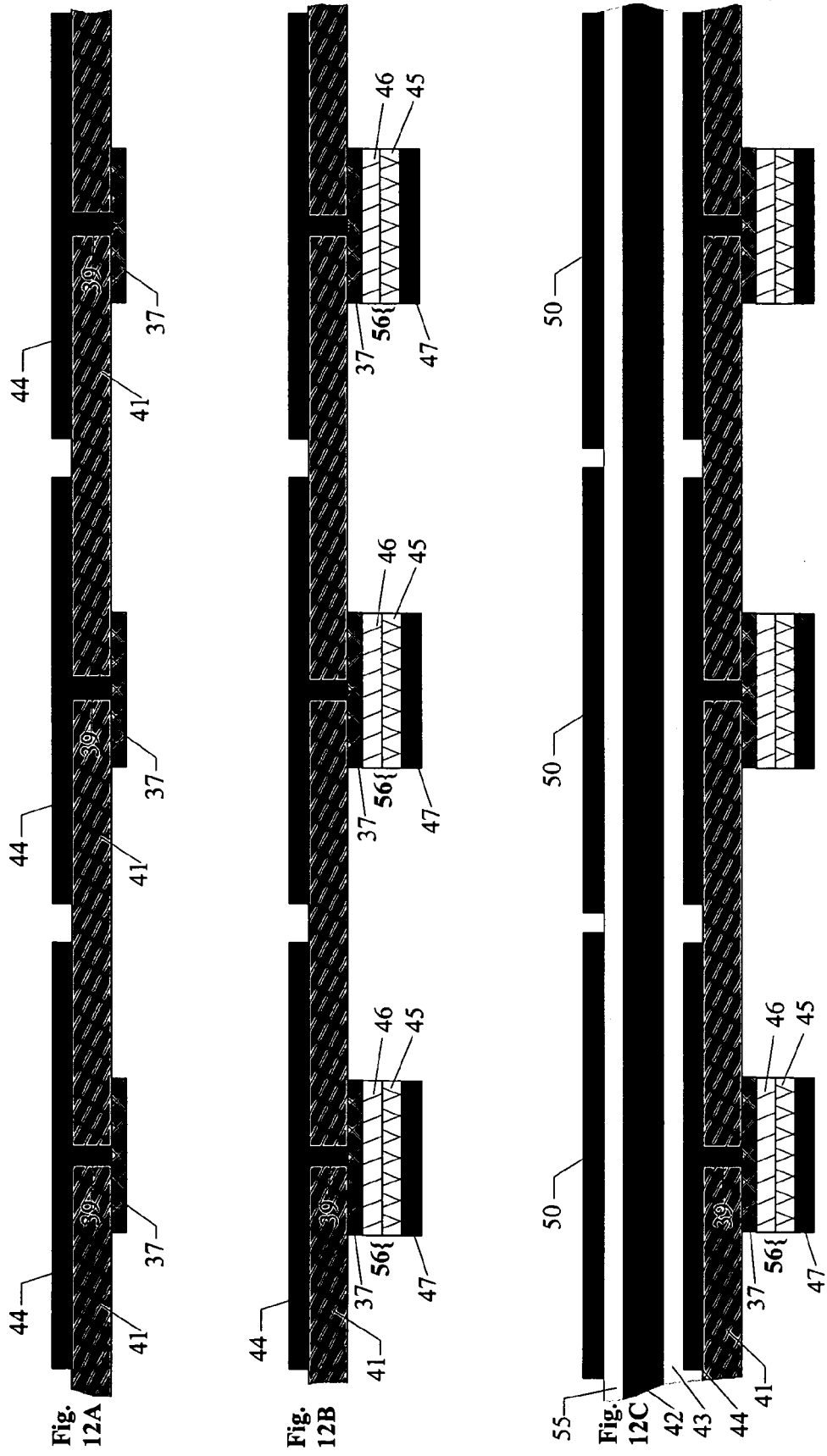

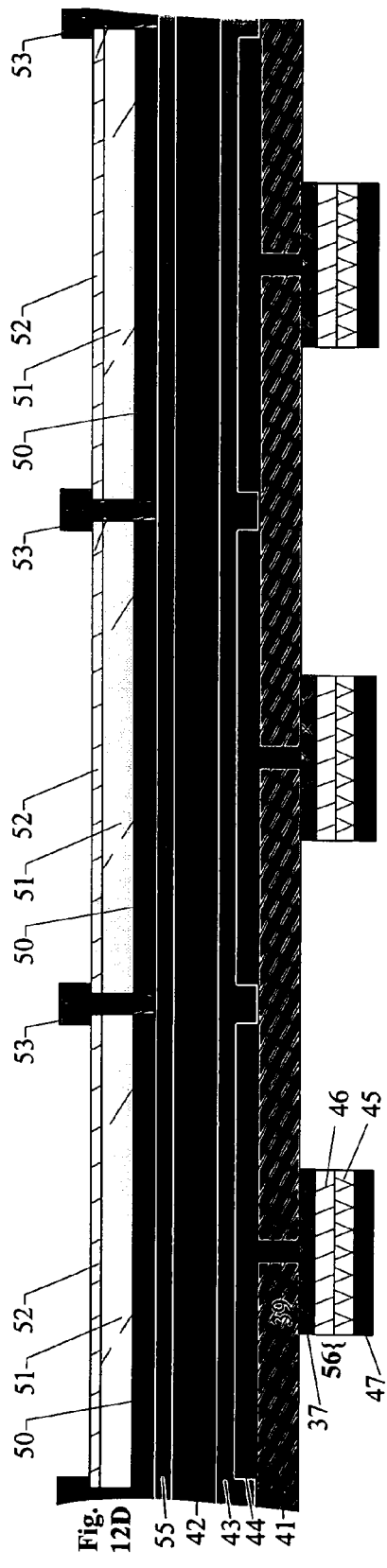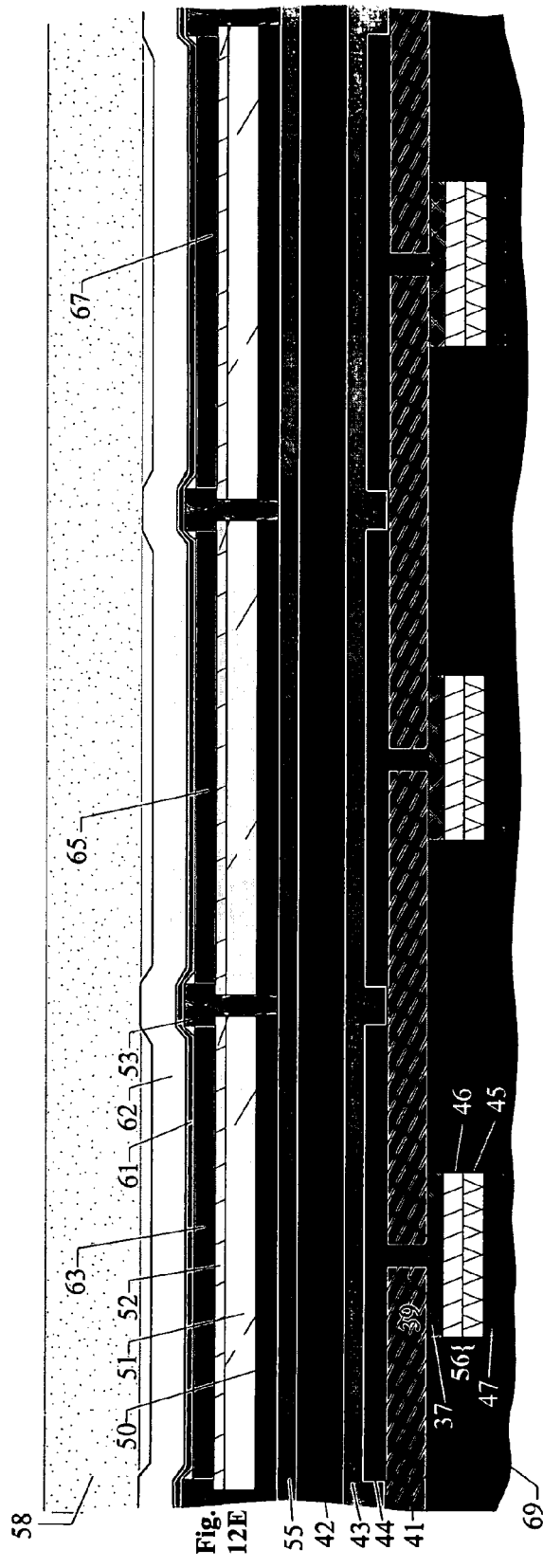
Fig. 12D CATHODE FRONT with RECTIFIER DIODE on SUBSTRATE BOTTOM
Fig. 12E

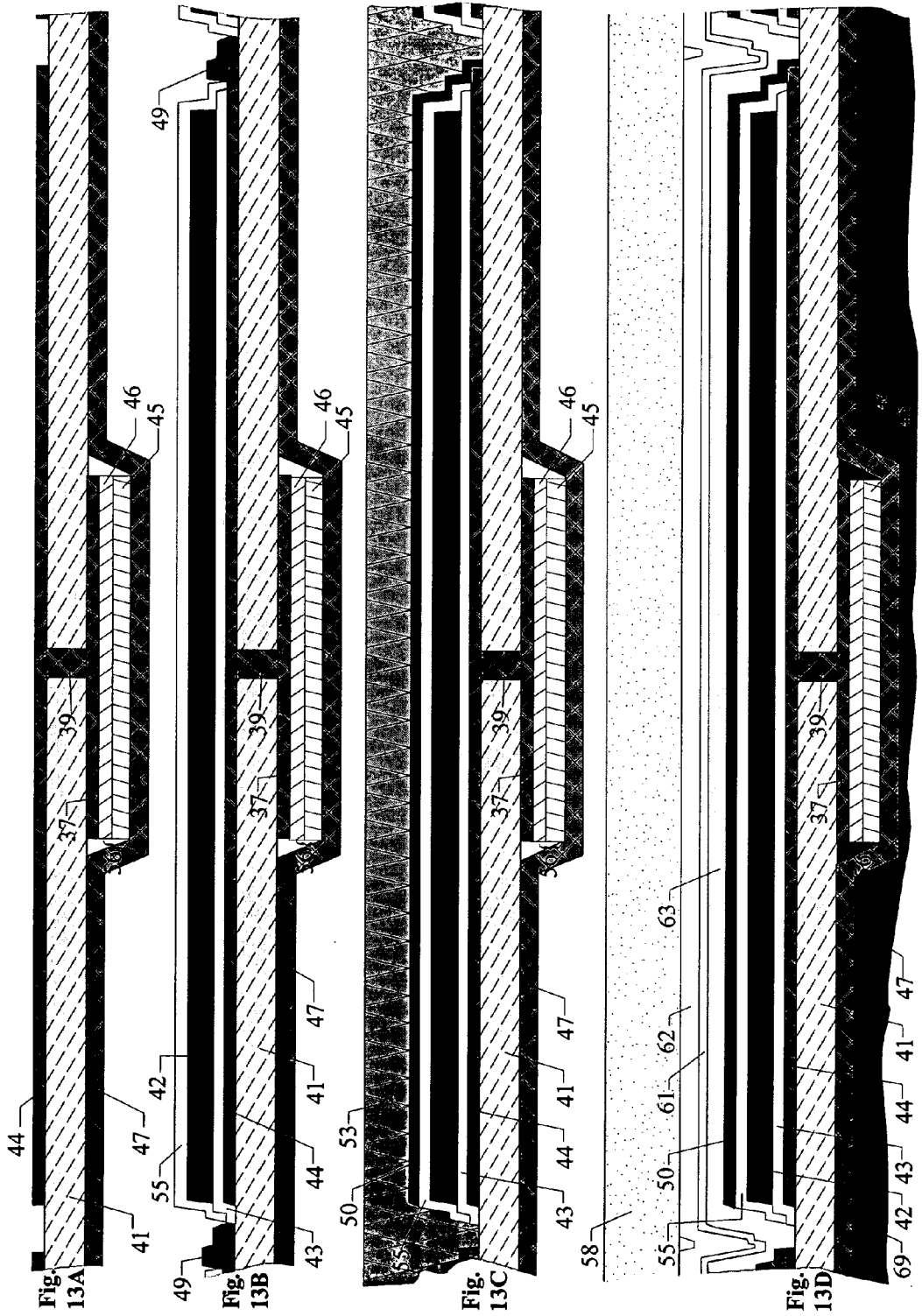

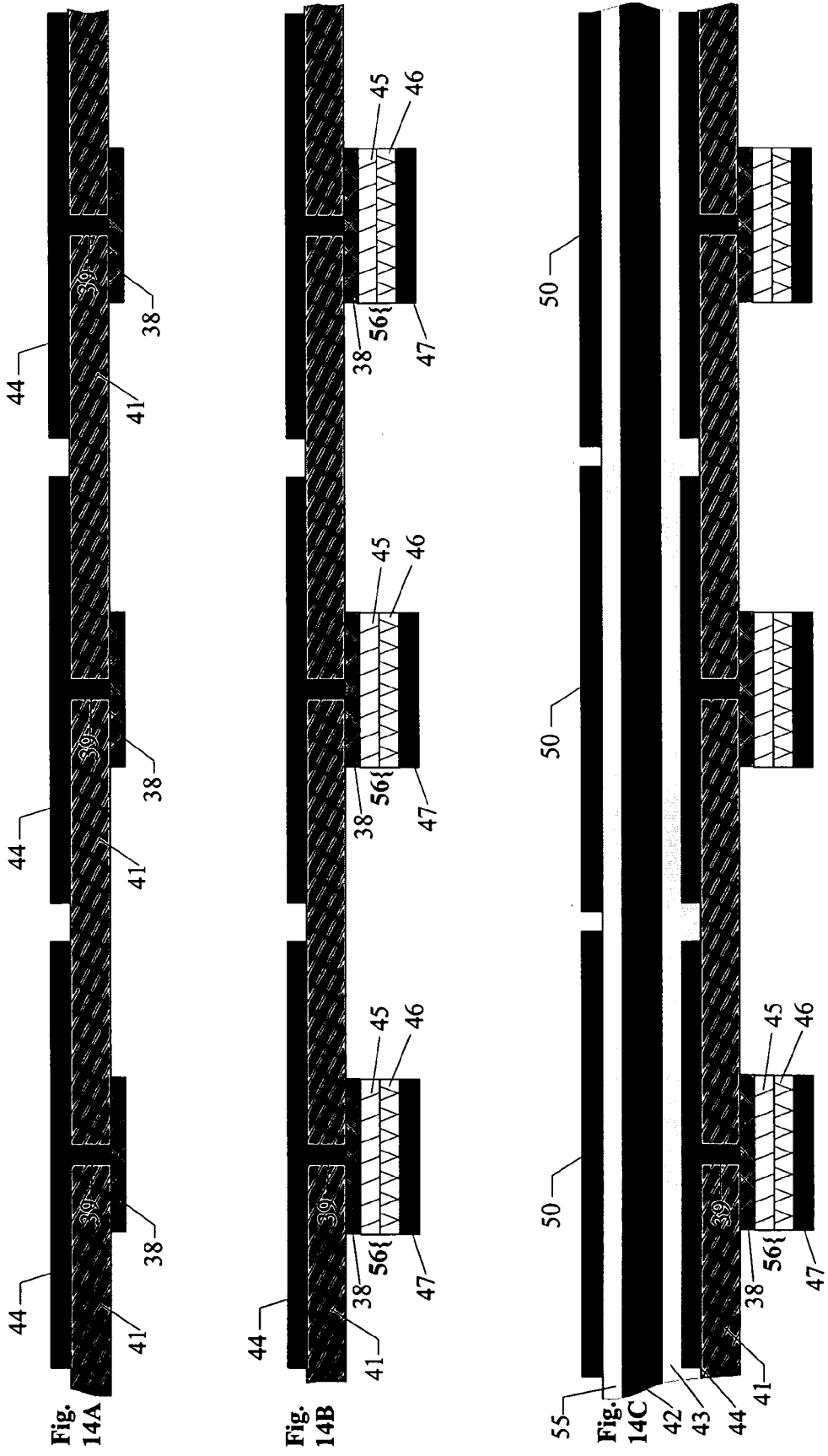

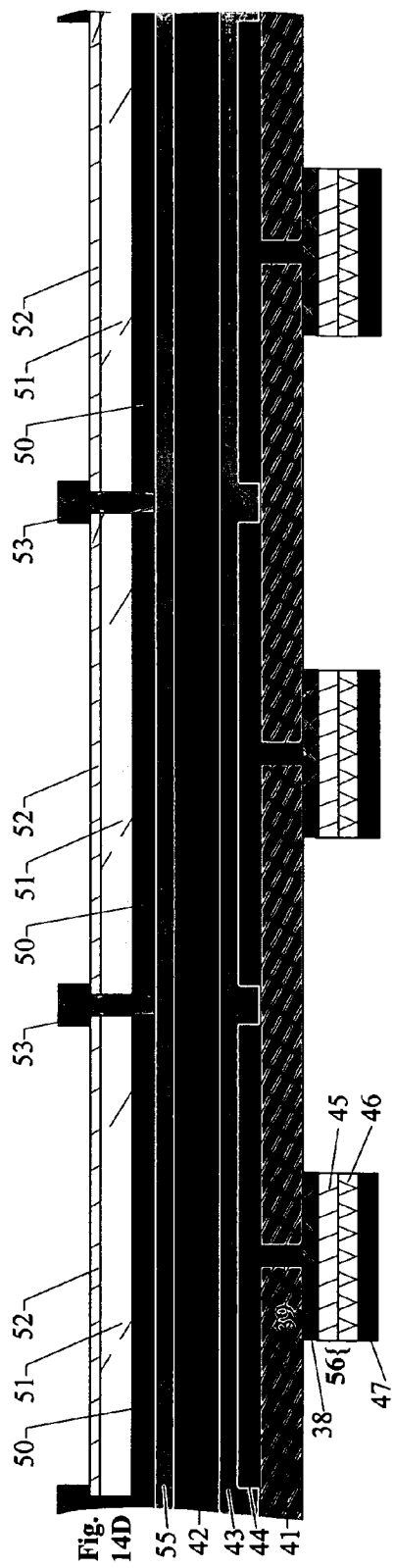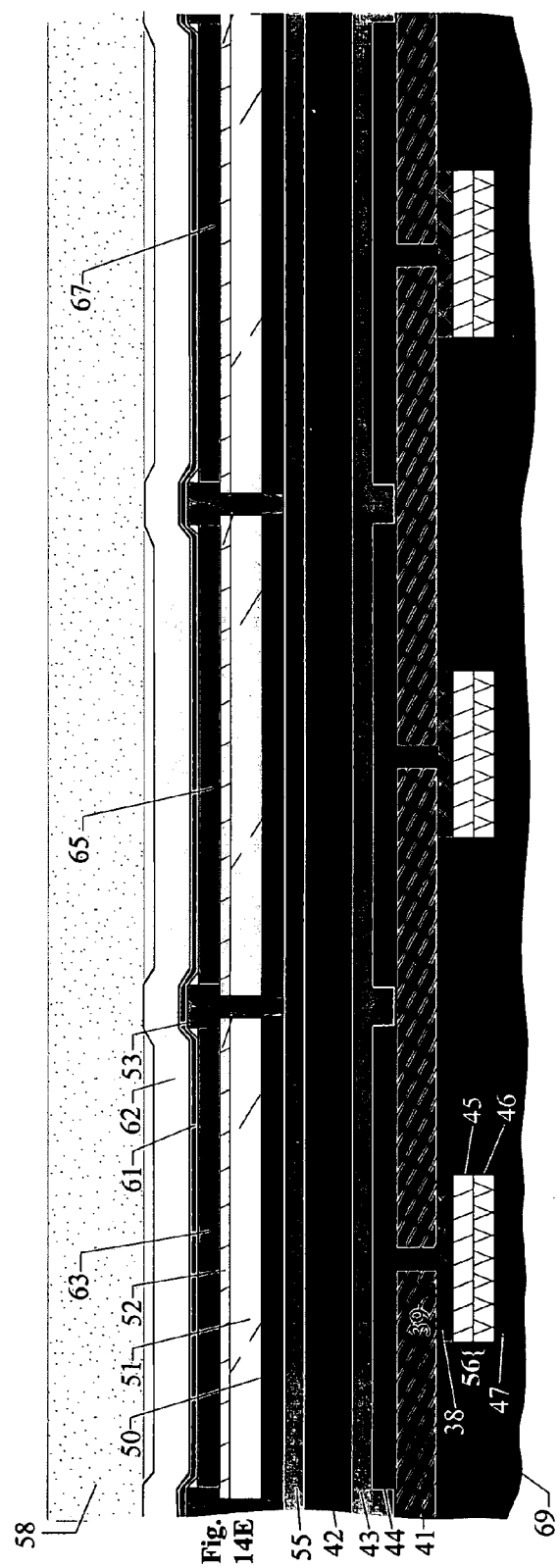

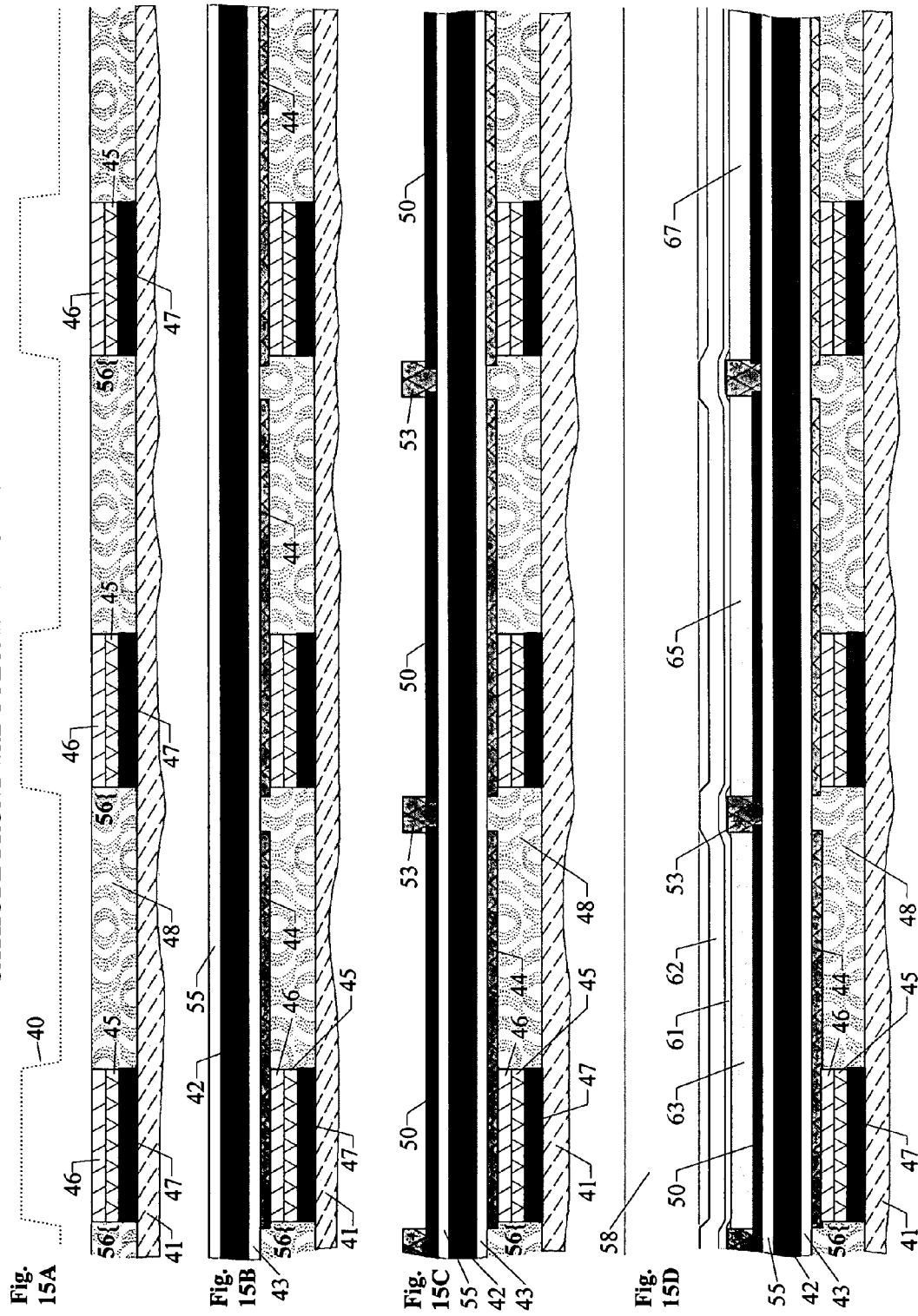

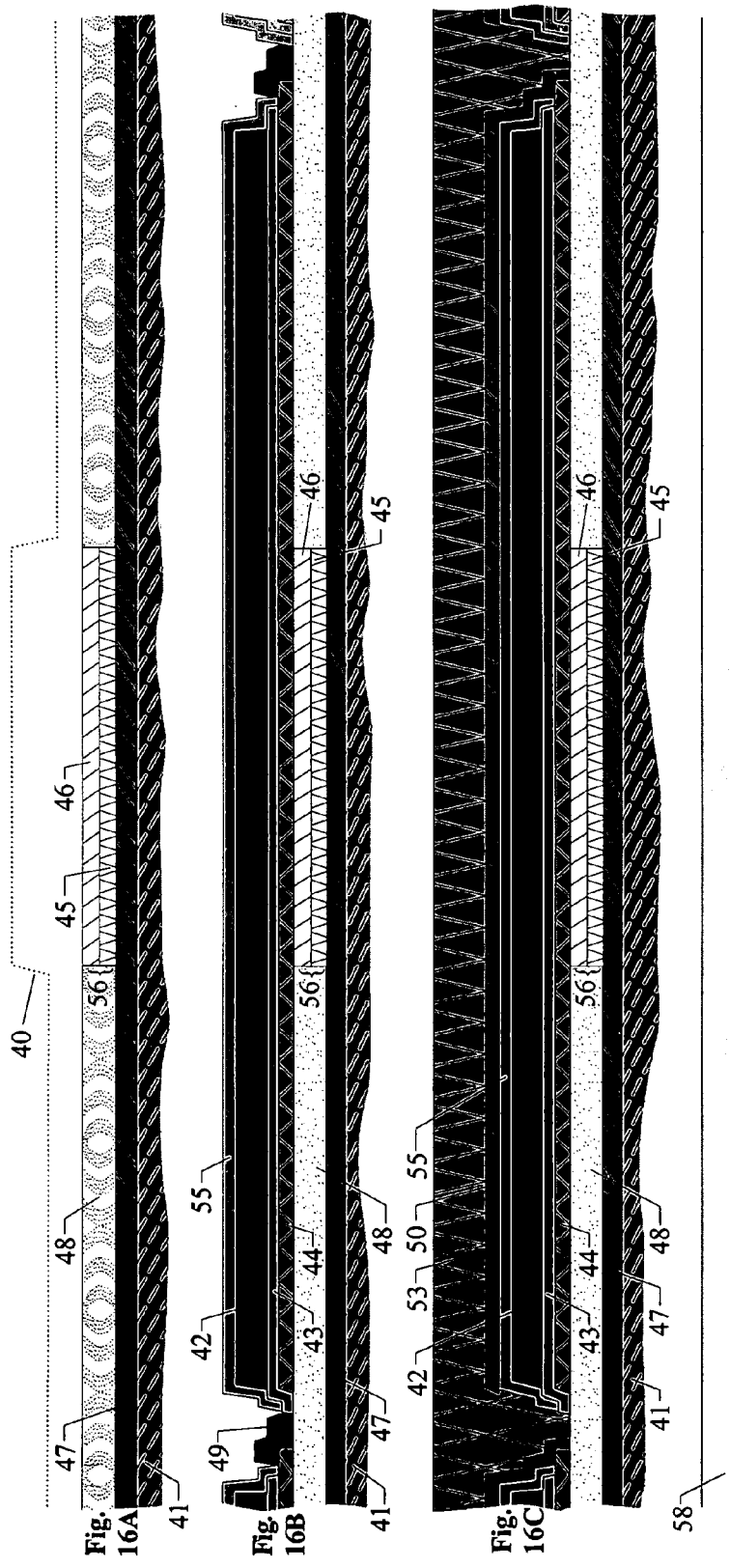
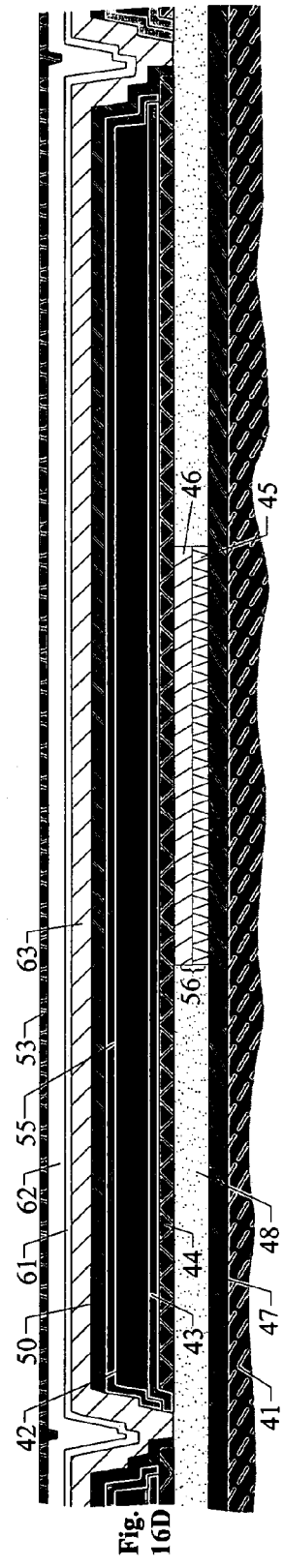
SIDE VIEW CATHODE FRONT with COLUMN ELECTRODE on SUBSTRATE
Fig. 16A
Fig. 16B
Fig. 16C
Fig. 16D

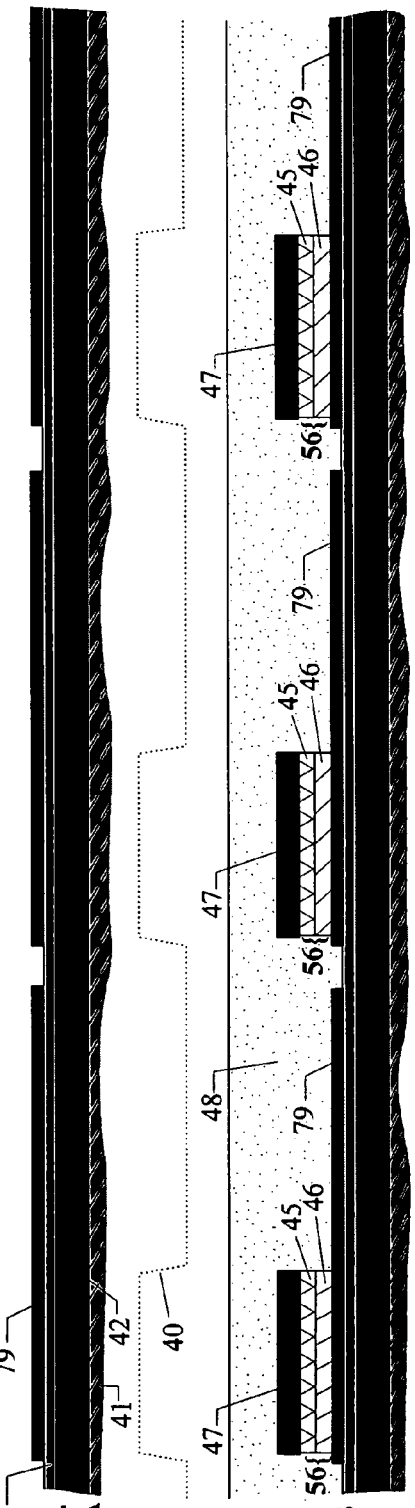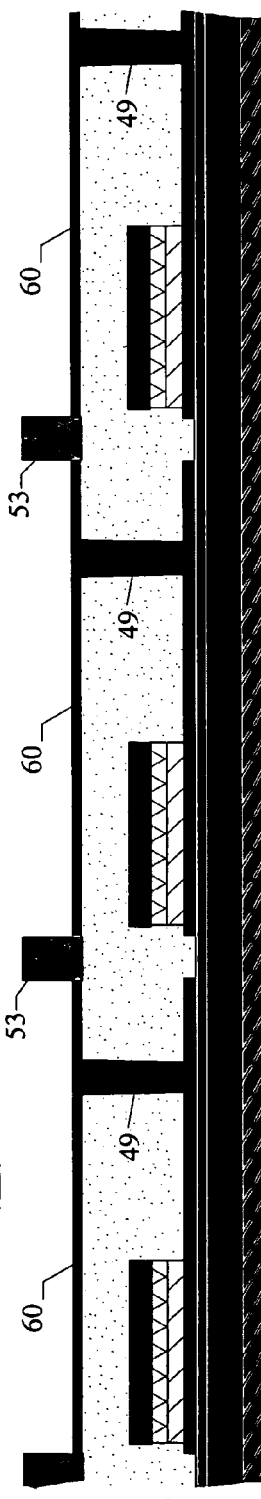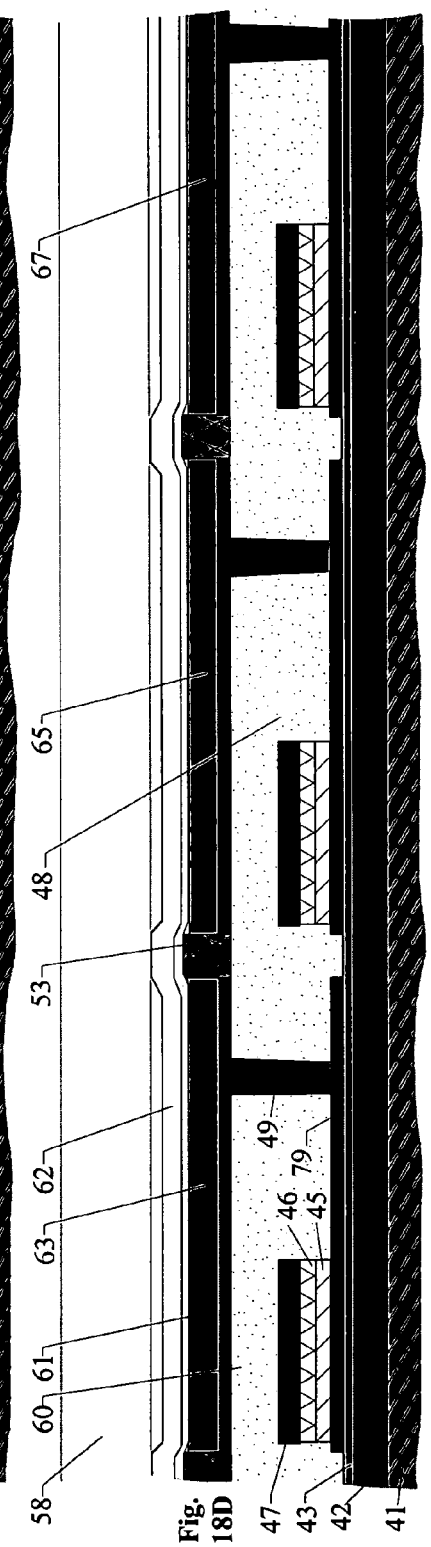

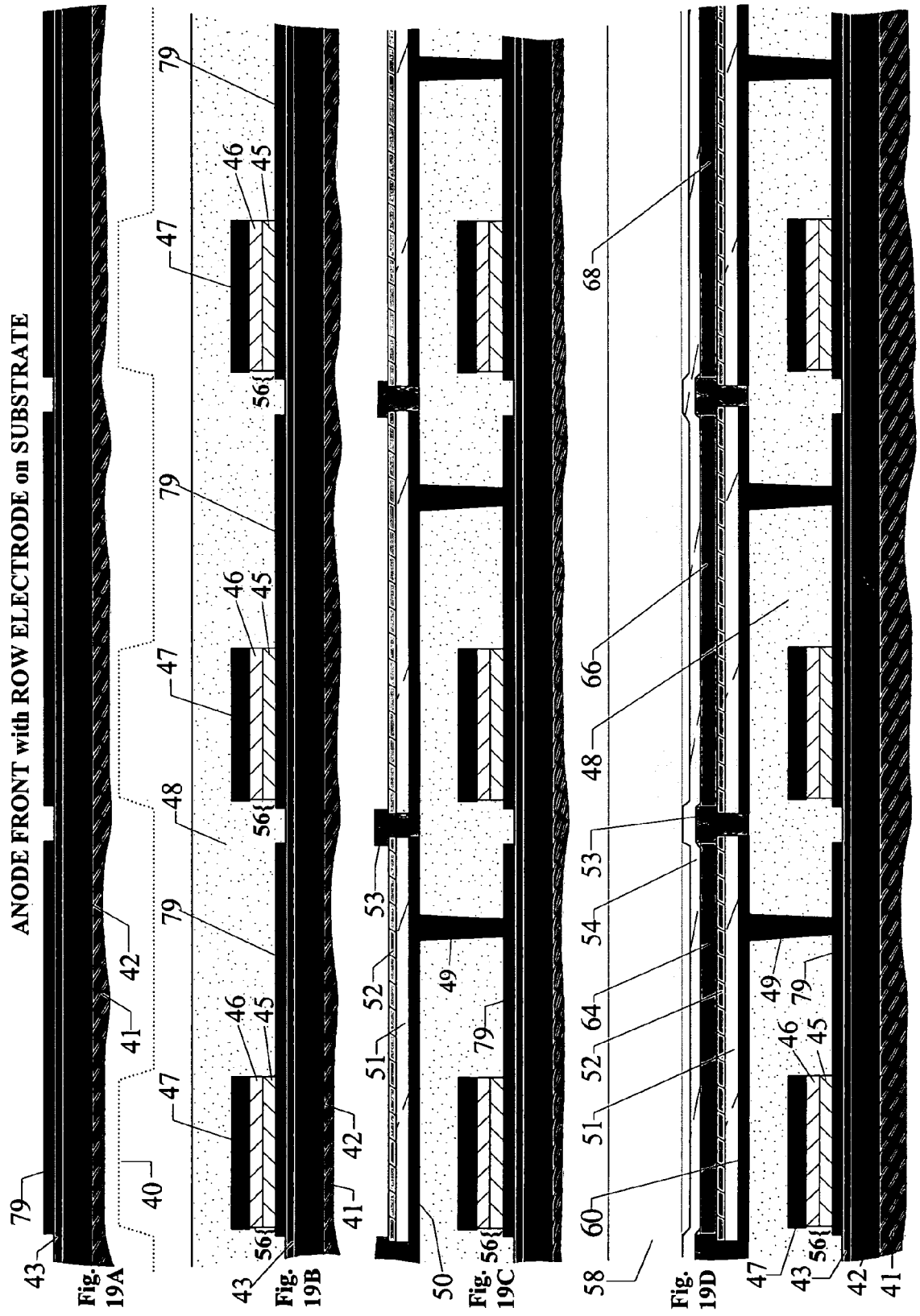

FIG. 20, CATHODE FRONT CIRCUIT DIAGRAM with BLOCKING DIODE IN SERIES TO OLED
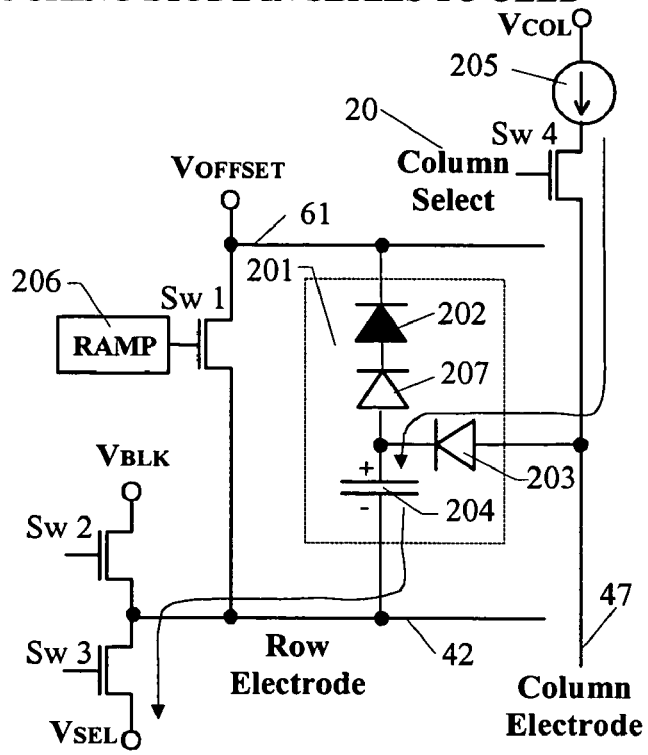
FIG. 21, ANODE FRONT CIRCUIT DIAGRAM with BLOCKING DIODE IN SERIES TO OLED
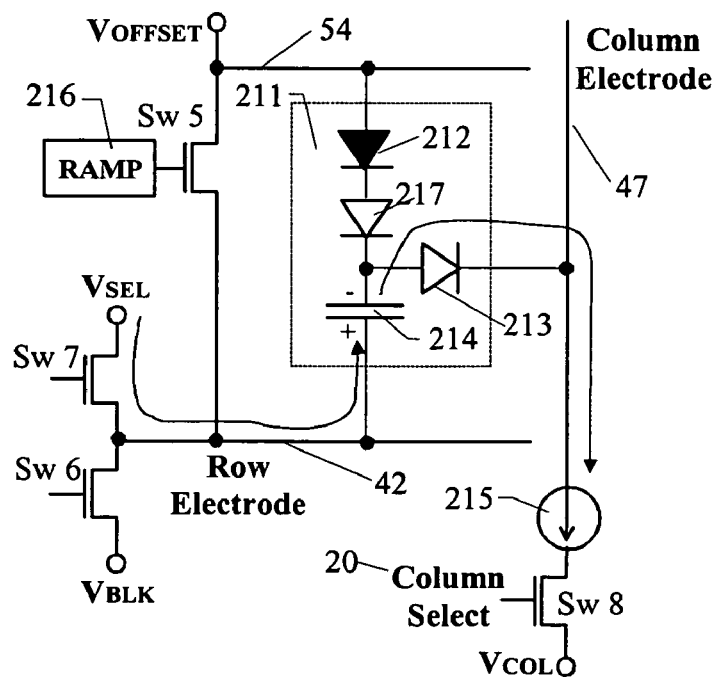

CATHODE FRONT STRUCTURE WITH BLOCKING DIODE IN SERIES TO OLED

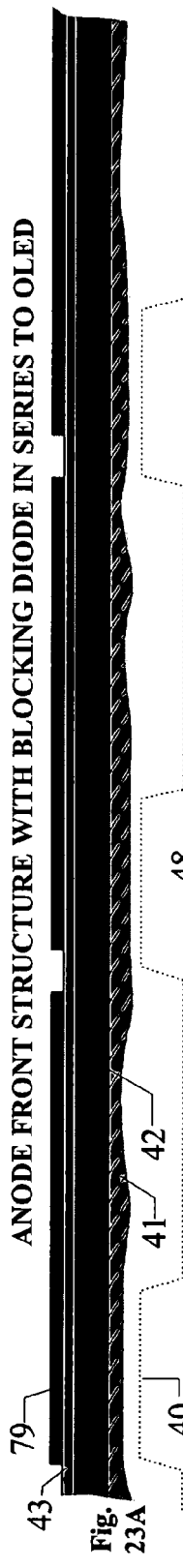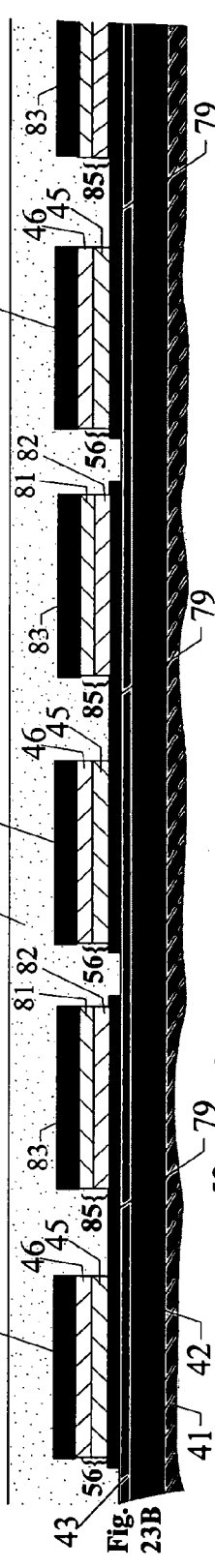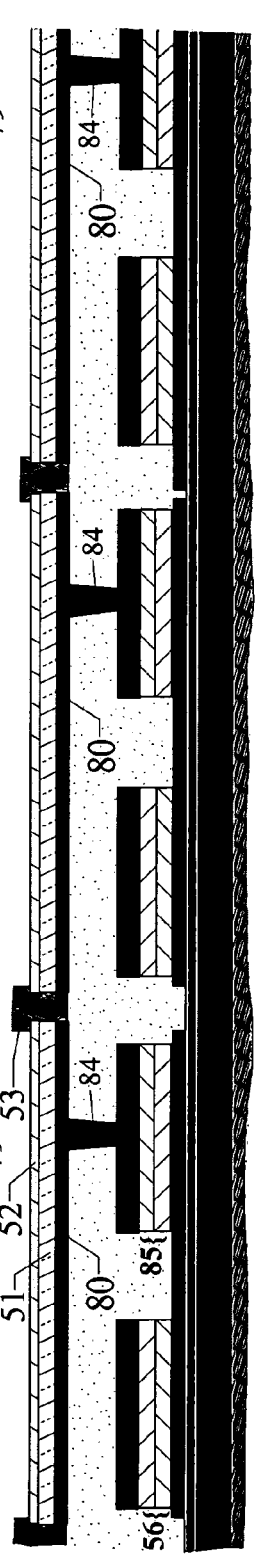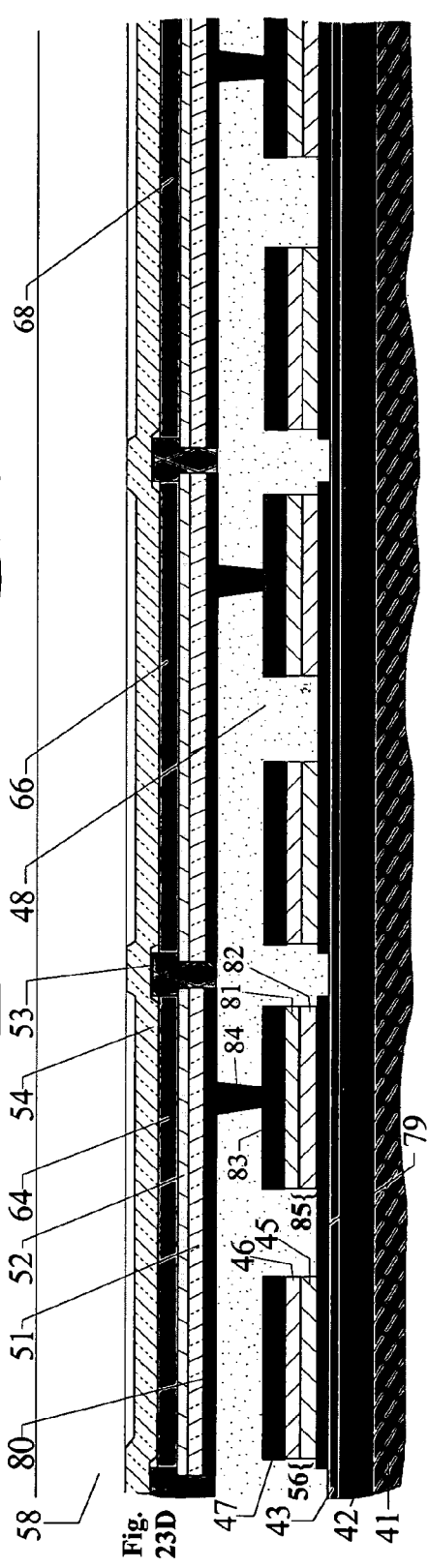

ORGANIC ELECTROLUMINESCENT DISPLAY DEVICE METHOD AND APPARATUS

RELATED APPLICATION

This is a continuation-in-part under 35 U.S.C. 120 of U.S. application Ser. No. 10/277,500, filed Oct. 22, 2002, now U.S. Pat. No. 6,861,810, which claims priority under 35 U.S.C. 119(e) of Provisional Application Ser. No. 60/335,216, filed Oct. 23, 2001.

FIELD OF THE INVENTION

The present invention relates generally to an organic EL (electroluminescent) device and more specifically to a driving method and apparatus for such a device.

BACKGROUND OF THE INVENTION

There are two types of organic EL display devices, a passive (a simple matrix) and an active (an active matrix), and development of both is being enthusiastically performed. Furthermore, organic materials are divided into low molecular weight (monomer) organic EL materials and high molecular weight (polymer) organic EL materials. Both are being vigorously researched, where a film of low molecular weight organic EL material is mainly formed by evaporation, while a film of high polymer organic EL material is mainly formed by application.

A drawback with organic EL devices is that they are difficult to drive using simple two-terminal schemes because of their lack of memory. The rise and decay time of an organic EL device is very fast and it does not have intrinsic memory. To overcome this problem, thin-film-transistor (TFT) circuits have been developed to drive organic EL devices. As illustrated in FIG. 1, these circuits include four or more TFTs, a storage capacitor and an organic EL pad arranged on a substrate. The storage capacitor enables the excitation power to an addressed EL element to stay on once it is selected.

While successfully overcoming the above-mentioned problem, new problems in manufacturing are created. The storage capacitor process and deposition are very complicated and difficult to achieve in a fabrication process. The TFTs fabrication requires several mask steps whose difficulty and cost increase dynamically as the display size increases. Plus if the substrate is plastic an expensive laser annealing process is used in fabrication of the TFT.

SUMMARY OF THE INVENTION

Accordingly, it is highly desirable to provide a new and improved light emitting apparatus and a method for driving it.

It is an object of the present invention to provide a light emitting apparatus, without resorting to the use of TFTs, with memory and a drive method for this new apparatus structure.

The above problems are solved by a simple structure, for the light emitting apparatus, consisting of an organic light emitting diode, a rectification diode and a simple capacitor used for memory. The display device is a matrix of light emitting apparatus configured for the display aspect. A matrix of electrodes consisting of row select and column data electrodes plus a common front electrode serve as interconnect for the components in each light emitting apparatus.

During display address period, OLED column driver ICs supply a constant current to selected column electrodes which charges the memory capacitors. Row scan driver IC outputs apply scan select pulses to the row select electrodes during the display address period. After the memory capacitor has been charged in the display address period, a ramp voltage is applied to the row select electrodes forcing the discharge of the memory capacitor through the light emitting diode, thus producing light output.

BRIEF DESCRIPTION OF THE DRAWINGS

The invention will be described in detail with reference to the following drawings in which like reference numerals refer to like elements wherein:

FIGS. 12A through 12E is of the structure for a cathode front with rectification diode on substrate bottom;

FIGS. 13A through 13D is the side views of the structure for a cathode front with rectification diode on substrate bottom;

FIGS. 14A through 14E is of the structure for an anode front with the rectification diode on substrate bottom;

FIGS. 15A through 15D is of the structure for a cathode front with column electrode on the substrate;

FIGS. 16A through 16D is the side views of the structure for a cathode front with column electrode on the substrate;

FIGS. 17A through 17D is of the structure for an anode front with column electrode on the substrate;

FIGS. 18A through 18D is a cathode front with row electrode on substrate; and

FIGS. 19A through 19D is an anode front with row electrode on substrate;

FIG. 20 is a cathode front circuit diagram with a blocking diode in series to the light emitting diode;

FIG. 21 is an anode front circuit diagram with a blocking diode in series to the light emitting diode;

FIGS. 23A through 23D an anode front structure with a blocking diode in series to the OLED.

DETAILED DESCRIPTION OF THE INVENTION

Figure 1:
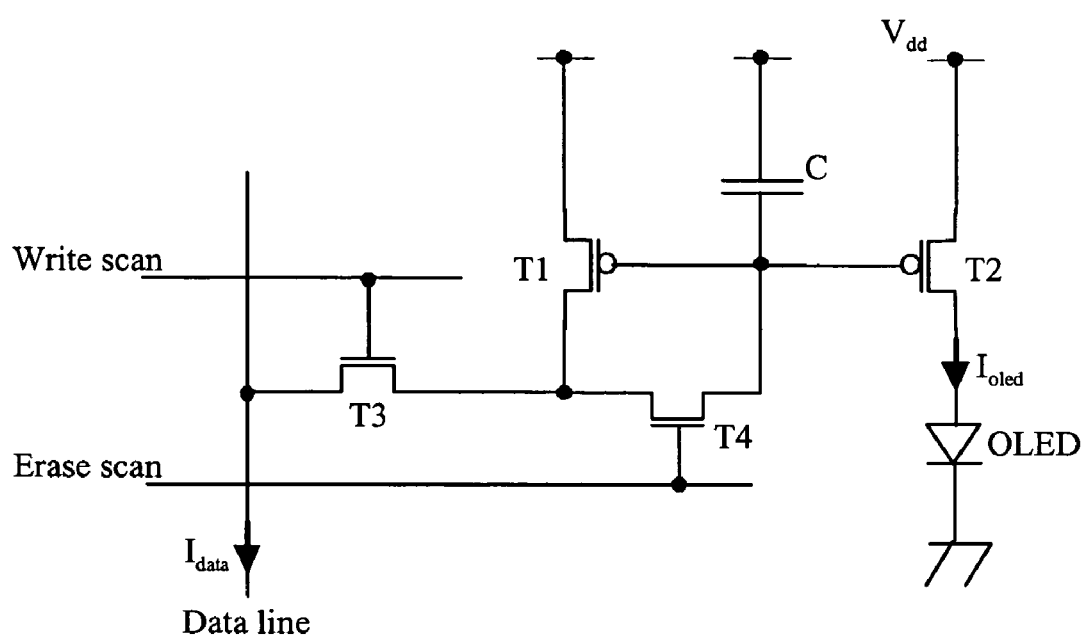
FIG. 1 is a circuit diagram showing a 4-transistor pixel driver of prior art.
Figure 2:
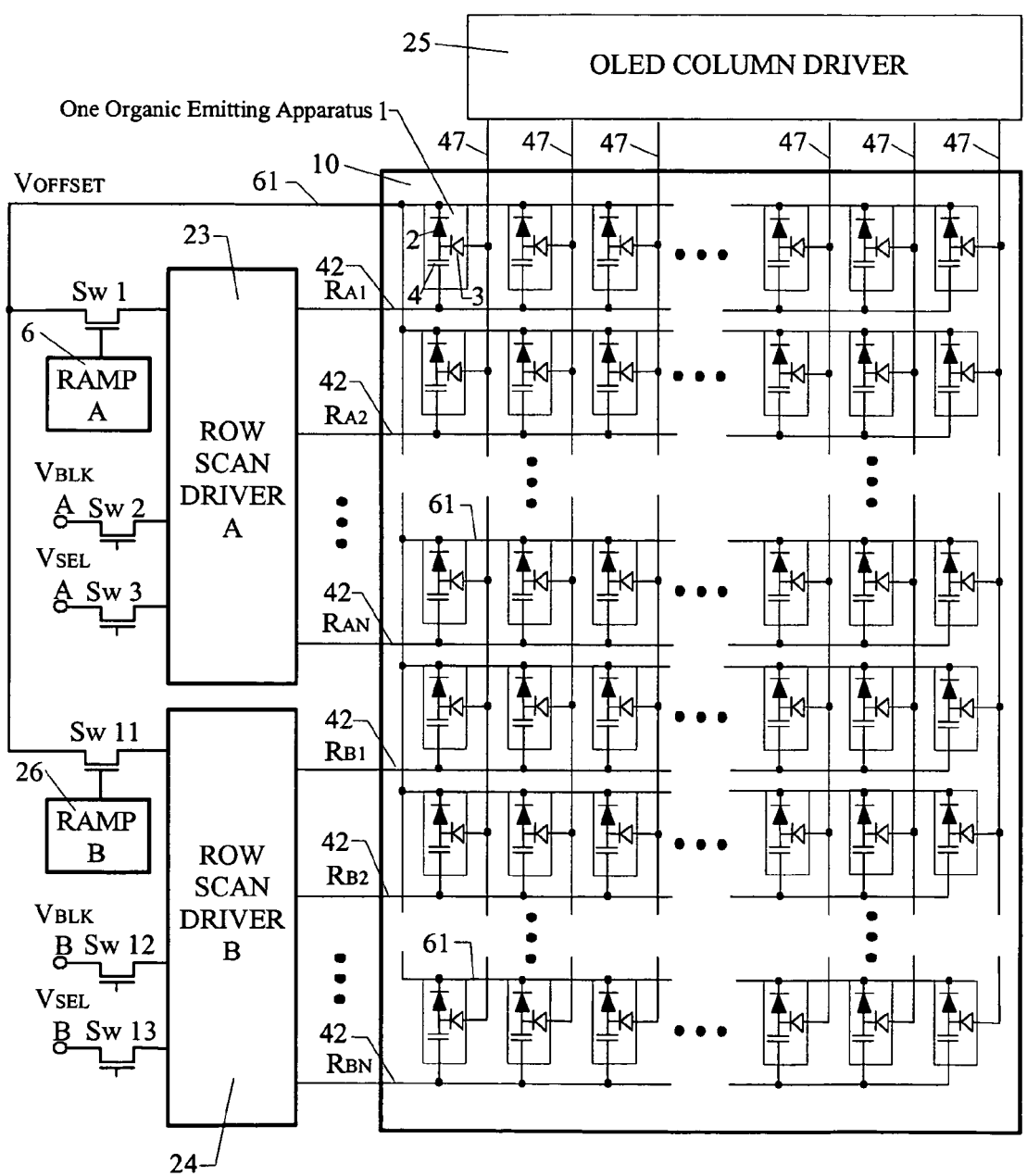
FIG. 2 is a circuit diagram of an OLED display drive

An organic light emitting diode display drive is illustrated in FIG. 2. As shown in FIG. 2, each organic emitting apparatus 1 consists of an organic light emitting diode 2, a rectification diode 3 and a memory capacitor 4. The charge stored in the capacitor during its addressing period is discharged through the light emitting diode during the light output period. To be able to take advantage of existing row scan driver ICs an Address Display Together (ADT) scheme is used. For example while Row Scan Driver A 23 is selecting rows (address period), Row Scan Driver B 24 has a ramp voltage output (light output period). The OLED Column Driver 25 IC.'s exceptionally tight current matching of adjacent outputs ensures uniform luminance and high-quality gray scaling. For color displays the column electrodes are in a RGB pattern and the current source magnitude of each color can be set independently. This makes possible for a white balance of the display.

As shown in FIG. 2 the display 10 is an array of light emitting apparatus 1 configured for the display aspect. A matrix of electrodes consisting of row select electrodes 42 and column electrodes 47, plus a common front electrode 61 serve as interconnect for the components in each light emitting apparatus 1. During display address period, OLED Column Driver 25 ICs supply a constant current to selected column electrodes 47, which charges the memory capacitor 4 in the light emitting apparatuses 1. The ADT scheme divides the row scan drive into A and B parts. While part A is addressed, Row Scan Driver A 23 outputs apply select pulses to the row select electrodes 42. Sw 3 applies $V_{SEL}$ to the Row Scan Drive A 23; a voltage selectively applied to row select electrodes 42. Sw 2 applies the $V_{BLK}$ voltage to Row Scan Drive A 23; a voltage applied to non-selected row select electrodes 42. Charging path for the memory capacitors 4 is from the OLED Column Driver 25, down the column electrodes 47 through the rectifier diode 3, the memory capacitor 4, across the row select electrode 42, through Row Scan Driver A 23 and Sw 3 to $V_{SEL}$. After the memory capacitors have been charged in display address period A, a ramp A 6 voltage is applied through Sw1 to the Row Scan Driver A 23, whose outputs apply the ramp voltage to row select electrodes 42. This ramp voltage forces the discharge of the memory capacitors through their respective light emitting diodes 2, producing light output. After Row Scan Drive A 23 finishes it's address period, Row Scan Drive B 24 can start its address period. Sw 13 applies $V_{SEL}$ to the Row Scan Drive B 24; a voltage selectively applied to row select electrodes 42. Sw 12 applies the $V_{BLK}$ voltage to Row Scan Drive B 24; a voltage applied to non-selected row select electrodes 42. Charging path for the memory capacitors 4 is from the OLED Column Driver 25, down the column electrodes 47 through the rectifier diode 3, the memory capacitor 4, across the row select electrode 42, through Row Scan Driver B 24 and Sw 13 to $V_{SEL}$. After the memory capacitors have been charged in display address period B, a ramp B 26 voltage is applied through Sw11 to the Row Scan Driver B 24, whose outputs apply the ramp voltage to row select electrodes 42. This ramp voltage forces the discharge of the memory capacitors through their respective light emitting diodes 2, producing light output.

Figure 3A:
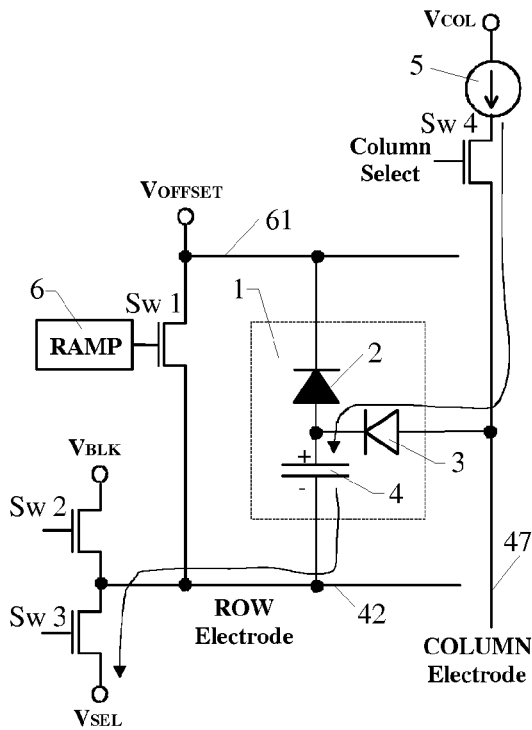
FIGS. 3A through 3C are a cathode front circuit diagram and drive waveform.
Figure 3B:
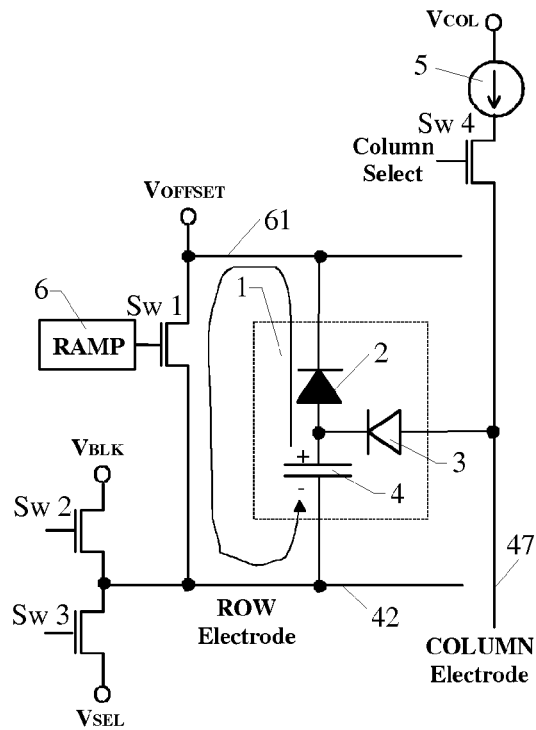
Figure 3C:
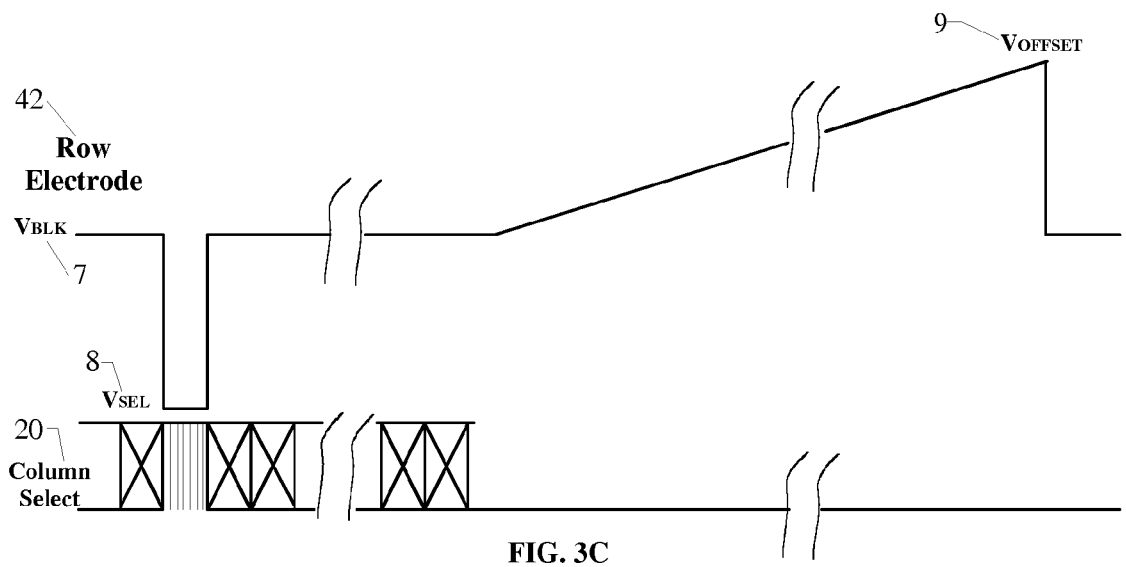

FIGS. 3A-3C shows a cathode front structure electrical equivalent circuit for driving an organic emitting apparatus 1 comprised of at least one light emitting diode 2, a rectification diode 3 and a memory capacitor 4 which serves as a memory device. The cathode of the organic light emitting diode 2 is to the front of the display. The OLED cathode electrode 61 covers the entire face of the display device and is connected to $V_{OFFSET}$. Current mode data programming is illustrated in FIG. 3A where Sw1 and Sw2 are initially OFF. The current path for charging the memory capacitor 4 (illustrated by the arrowed lines) is from the current source 5 through Sw4 of the column data driver IC, down the column electrode 47 and through rectification diode 3 to one of the electrodes for the memory capacitor 4. The other electrode of the memory capacitor 4 is the row select electrode 42 and the current through it to a Sw3 ON completes the charging path to $V_{SEL}$.

Pulse width modulated control of Sw4 is used to control the amount of charge to be stored in the memory capacitor 4. At the end of a row select period Sw3 turns OFF and Sw2 turns ON connecting the row electrode to $V_{BLK}$, a voltage level high enough to cause the rectification diode 3 to be reversed biased. Therefore, data changes on the column electrode 47 as subsequent rows are scanned, have no effect on the charge that was stored in the memory capacitor 4 during its row select period.

After completing the row scan (address period) the row electrode 42 is then slowly ramped to $V_{OFFSET}$ forcing the discharge of the memory capacitor 4 through the light emitting diode 2 (light emission period). The discharge path for the memory capacitor 4 (as shown in FIG. 3B arrowed line) is the forward current through the light emitting diode 2, the OLED cathode electrode 61, through Sw1 and across the row electrode 42 to the opposite side of the memory capacitor 4. Ramp 6 control for Sw1 sets the level of the forward current through the light emitting diode 2. An equilibrium current is reached when the change in memory capacitor voltage by discharge is equal to the rate of ramp waveform voltage increase. Light emitting diode 2 forward current stops when the ramp voltage reaches $V_{OFFSET}$ and the memory capacitors 4 have discharged to the threshold voltages of the light emitting diodes 2. The remaining charge left in the memory capacitor 4 leaves its voltage at the threshold voltage of the light emitting diode 2. Therefore, in subsequent sub-frames only charge for producing light output is added to each organic emitting apparatus's 1 memory capacitor 4.

The waveforms of FIG. 3C are for the row electrode 42 and column select 20 of Sw4. When the row electrode 42 is at $V_{BLK}$ 7 the rectification diode 3 is reversed bias and the row is not selected. At $V_{SEL}$ 8 the row is selected and the memory capacitor 4 is charging until Sw4 is turned OFF by pulse width modulated control. After the addressing period the row electrodes 42 are slowly ramped up to $V_{OFFSET}$ 9 which causes the memory capacitor 4 to discharge, at a small micro amp forward current, through the light emitting diode 2.

Figure 4A:
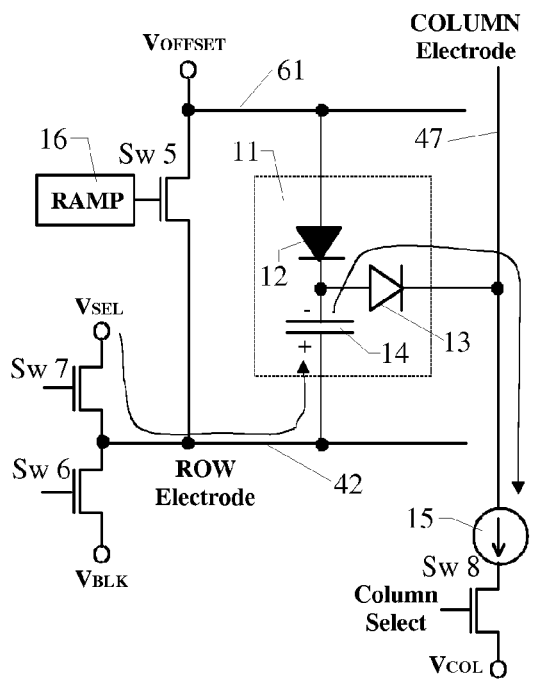
FIGS. 4A through 4C are an anode front circuit diagram and drive waveform.
Figure 4B:
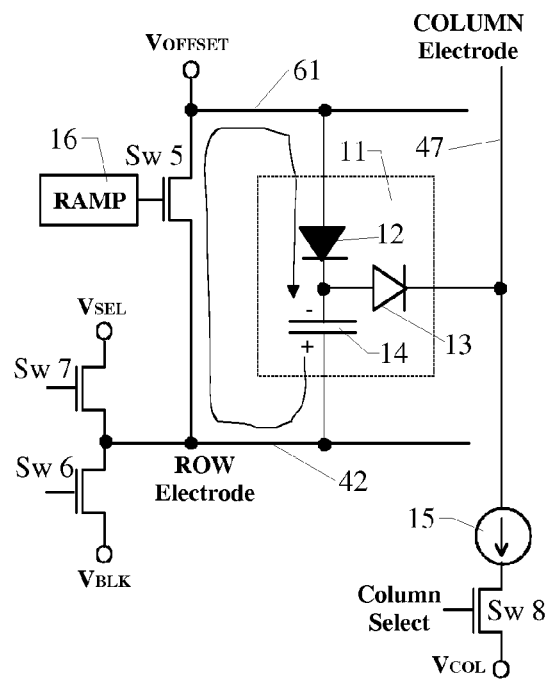
Figure 4C:
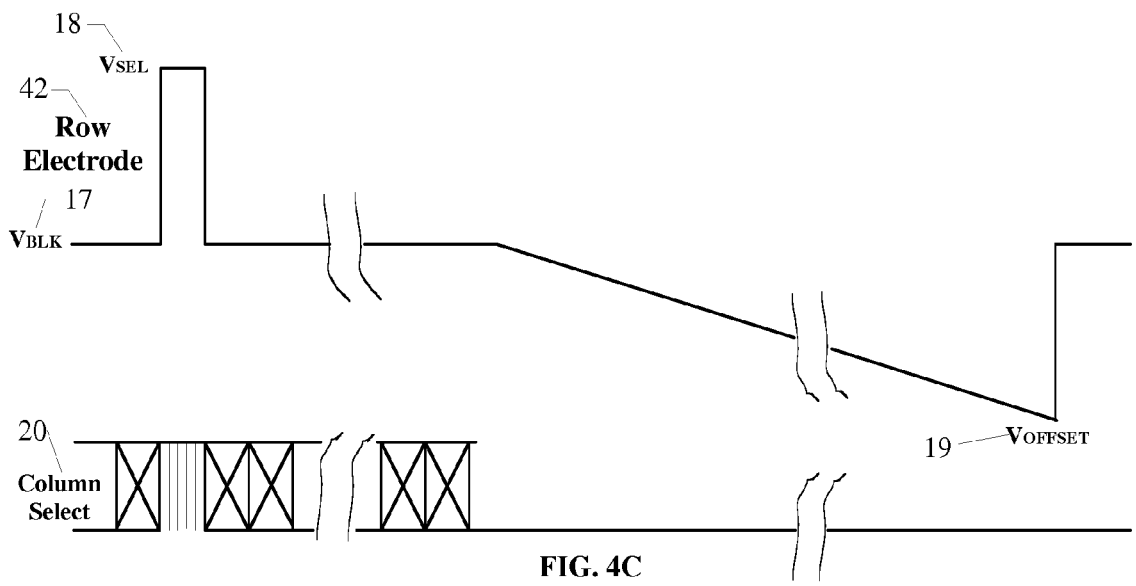

In FIGS. 4A-4C, the light emitting diode 12 anode is connected to the common front electrode 61 of the display. The rectification diode 13 is configured in opposite direction as rectification diode 3. Column electrode drive is changed to a current sink circuit rather than a current source circuit as it is in the cathode front display structure. The row electrode 42 is selected when Sw7 is ON. During the address period the charging path for the memory capacitor 14 (arrowed lines FIG. 4A) is from $V_{SEL}$ through Sw7 across the row electrode 42 through the memory capacitor 14, the rectification diode 13, down the column electrode 47, through current sink 15 and Sw8 to $V_{COL}$. FIG. 4B illustrates the discharge path for the memory capacitor 14, which furnishes the forward current through the light emitting diode 12. The memory capacitor 14 discharge path (illustrated by the arrowed line in FIG. 4B) is across the row electrode 42, through Sw5 across the front electrode 61 and through the light emitting diode 12. The ramp 16 controls memory capacitor 14 rate of discharge. The waveforms shown in FIG. 4C are basically an inversion of those for the cathode front configuration. As shown in the figure, when row electrode 42 is at $V_{BLK}$ 17 the row is not selected. The row is selected when at $V_{SEL}$ 18, enabling charging memory capacitor 14. The ramp voltage goes down to $V_{OFFSET}$ 19 to discharge the memory capacitor 14. Column select 20 controls the pulse width modulation of Sw8 during the time $V_{SEL}$ 18 is high.

Figures 5A, 5B:
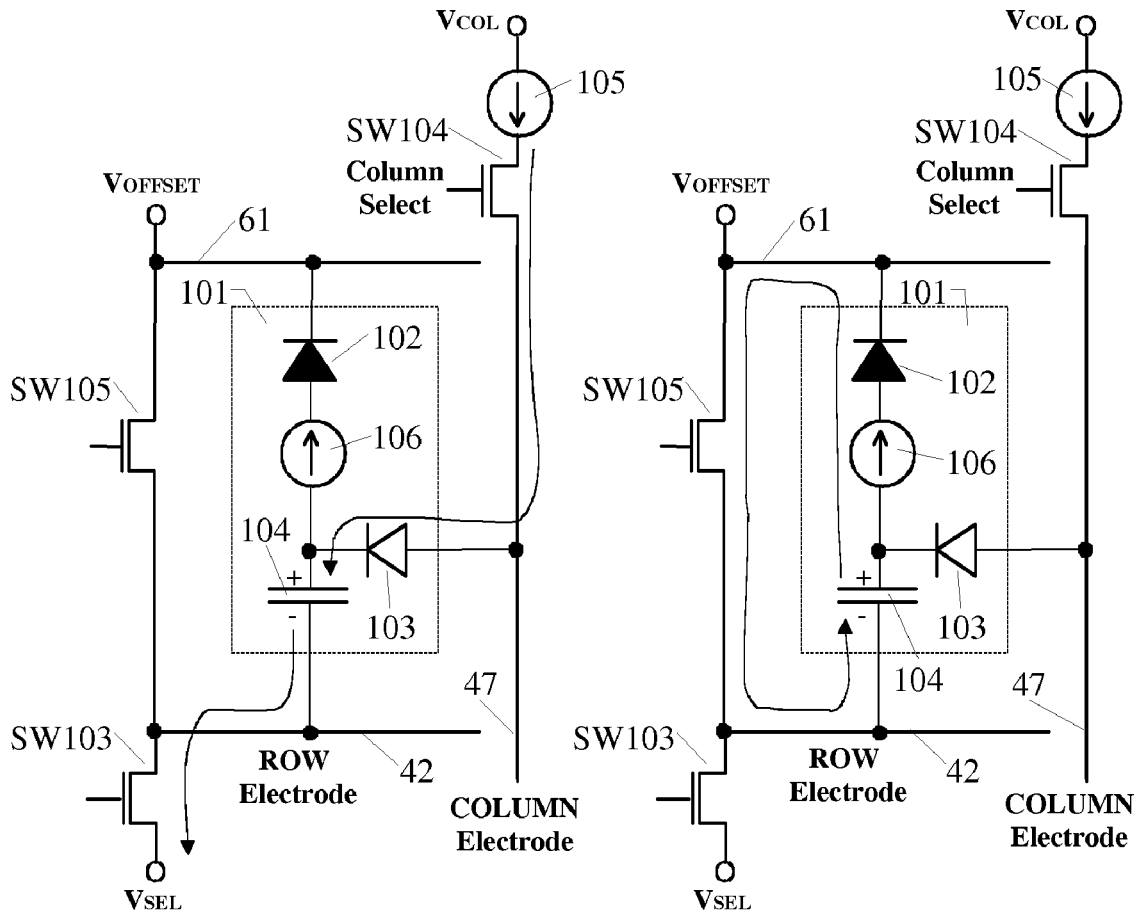
FIGS. 5A through 5C are of a cathode front, with a series current limit, circuit diagram and drive waveform.
Figure 5C:
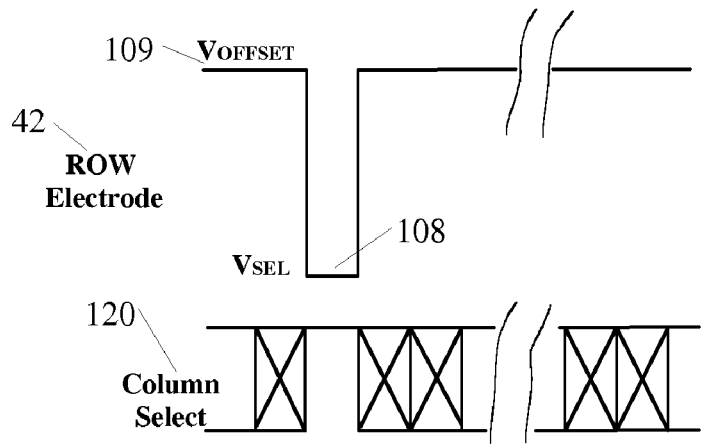

Another circuit configuration is that shown in FIGS. 5A-5C, a cathode front with a series current limit. The light emitting apparatus 101 has an additional component, a current limit device 106. Forward current through the light emitting diode is limited to a small micro amp level by the current limit device 106. The arrowed lines in FIG. 5A illustrate the charging path for the memory capacitor 104. This path is from $V_{COL}$, through current source 105, Sw104, down column electrode 47, through rectification diode 103, memory capacitor 104, row electrode 42, and Sw 103 to $V_{SEL}$. The arrowed in line FIG. 5B illustrates the discharge path for the memory capacitor 104 through the current limit device 106, the light emitting diode 102, across the front electrode 61, through Sw 105 and across the row electrode 42 to the opposite side of the memory capacitor 104. As illustrated in FIG. 5C, the row electrode 42 does not have a ramp voltage. After the row scan pulse of $V_{sel}$ 108 ends, the row electrode is returned to $V_{OFFSET}$ 109.

Figures 6A, 6B:
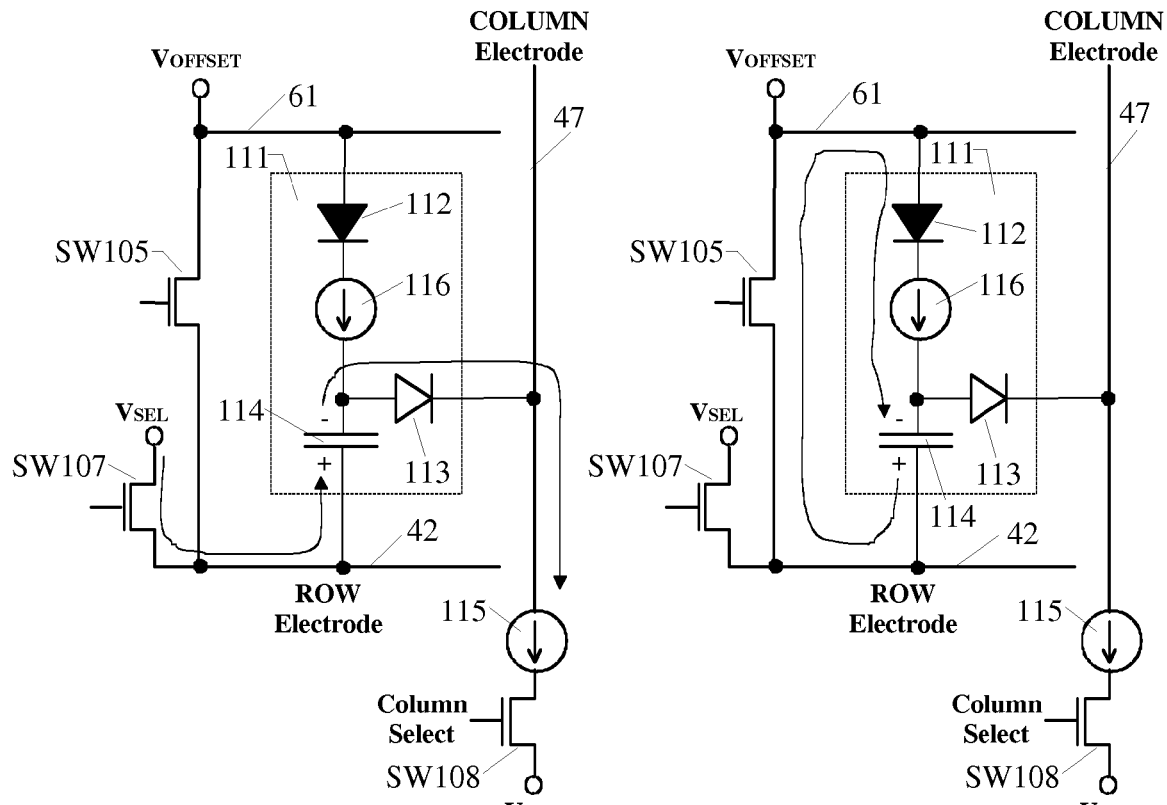
FIGS. 6A through 6C are an anode front, with series current limit, circuit diagram and drive waveform.
Figure 6C:
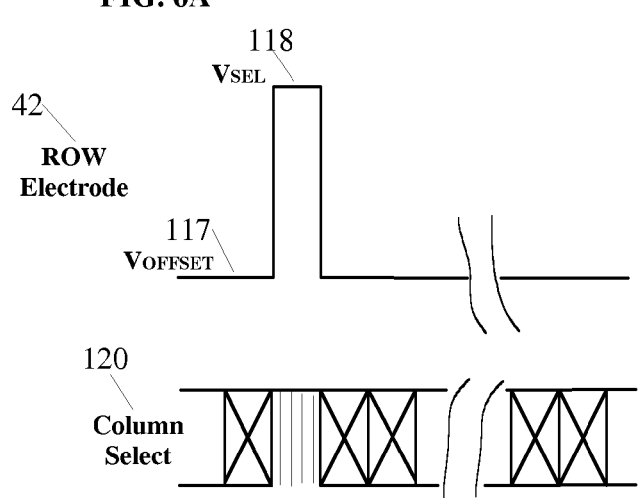

FIGS. 6A-6C, illustrates the anode front with a series current limit device 116 added to the light emitting apparatus 111. An anode front structure has the rectification diode 113 cathode to the column electrode 47. This configuration requires a current sink 115 for the column electrode 47. The row electrode 42 waveforms in FIG. 6C, is basically an inversion of the waveforms of FIG. 5C.

Figure 7:
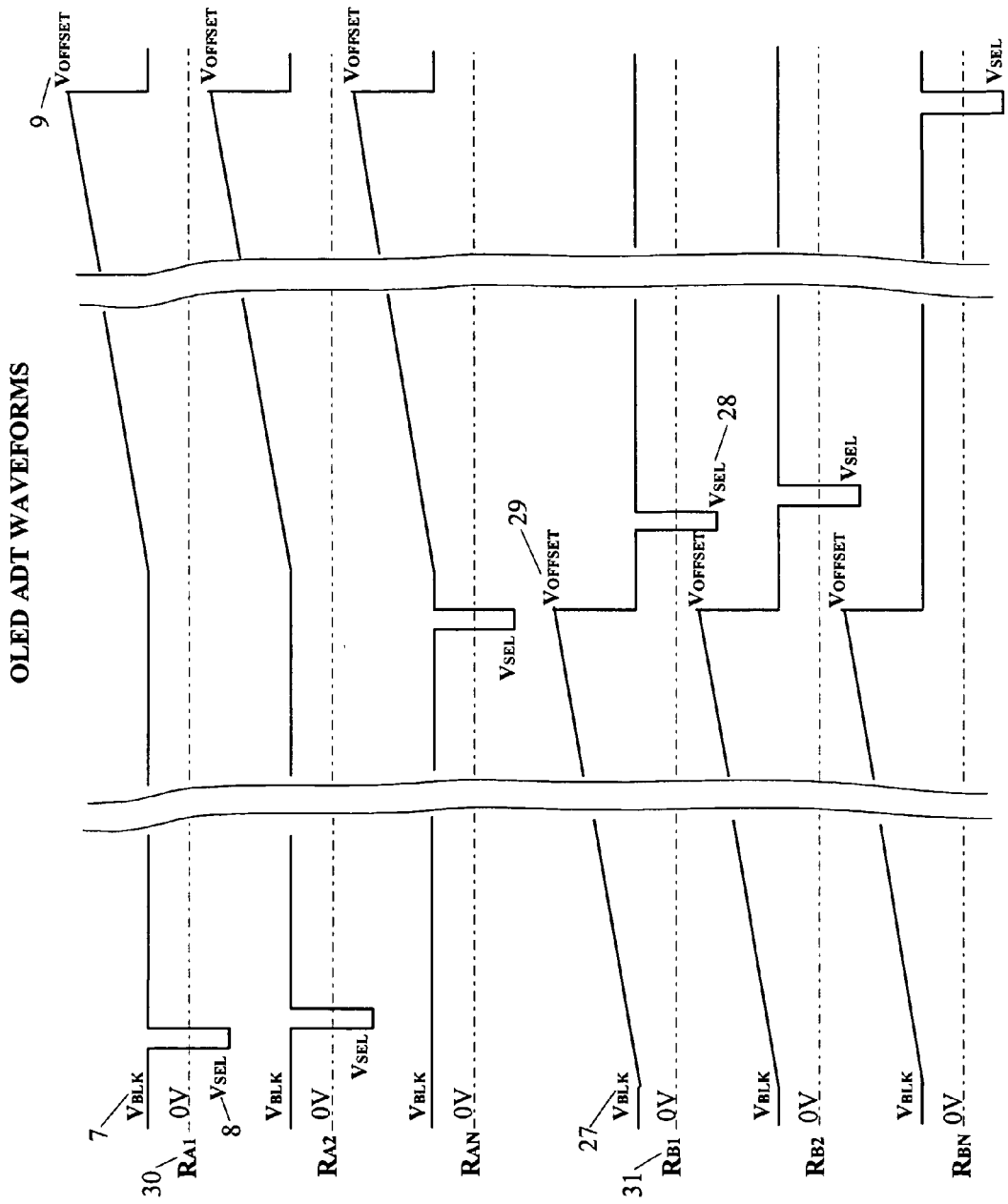
FIG. 7 is OLED row select ADT waveforms.

Shown in FIG. 7 are the row electrode waveforms for the ADT drive method. The row electrodes are divided into A and B groups of electrodes. As illustrated in the figure the first part of the waveforms, Group A 30 of electrodes has $V_{SEL}$ 8 pulses, while the Group B 31 of electrodes is being ramped to $V_{OFFSET}$ 29. During the second half of the waveform, Group A 30 electrodes are ramped to $V_{OFFSET}$ 9, while the Group B 31 of electrodes are pulsed to $V_{SEL}$ 28. This drive method allows external circuits, connected to the row select driver IC, to generate the select and ramp voltages.

Figure 8:
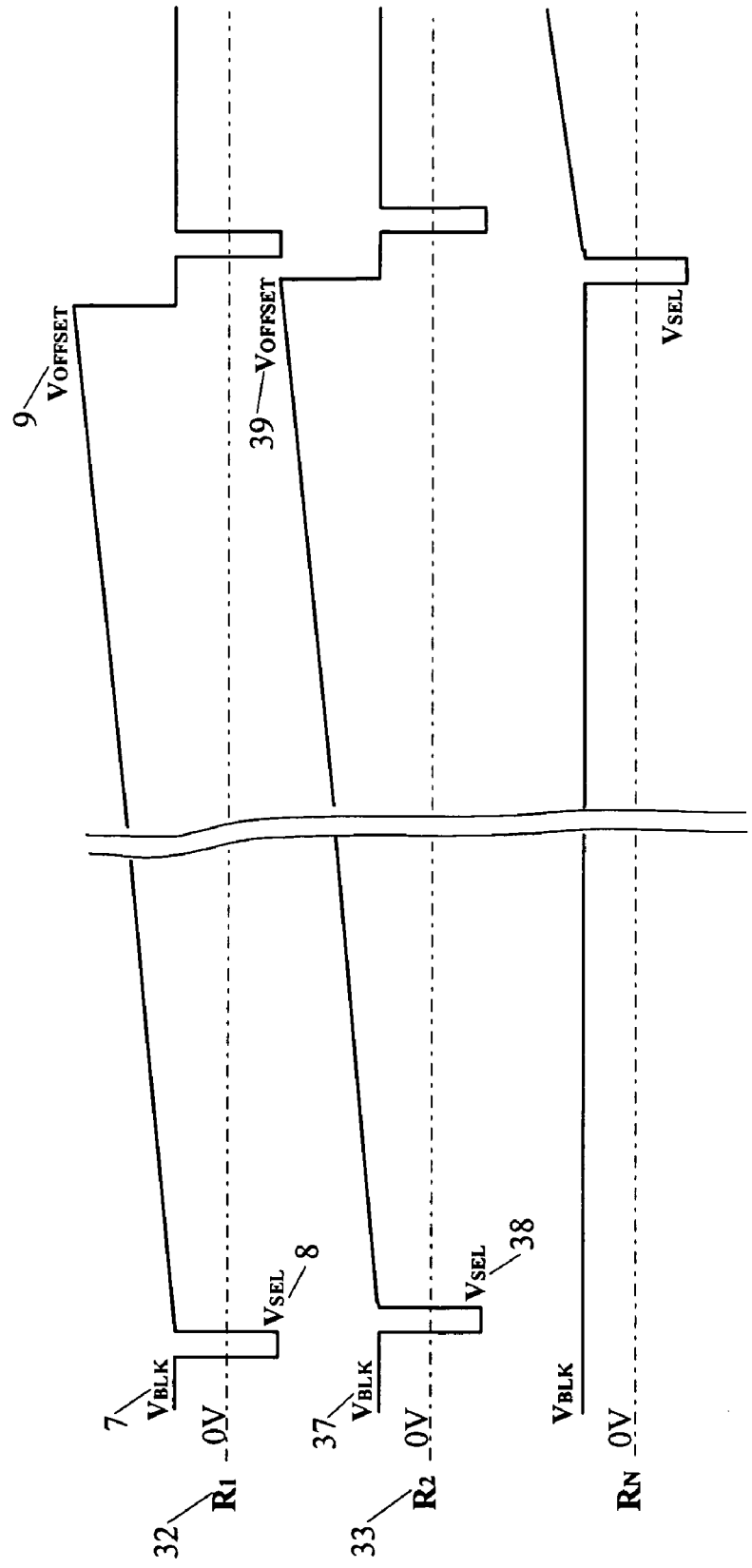
FIG. 8 is OLED row select independent ramp waveforms.

A new row scan driver IC design with the select pulse and ramp voltages generated internally, would have independent ramp control for each driver output. Resulting in almost continuous forward current through the light emitting diode 2. Waveforms for the row electrodes, that illustrate independent ramp voltages, are shown in FIG. 8. As shown in this figure the ramp voltage to $V_{OFFSET}$ 9 starts upward after $V_{SEL}$ 8 returns to $V_{BLK}$ 7.

Figures 9, 10:
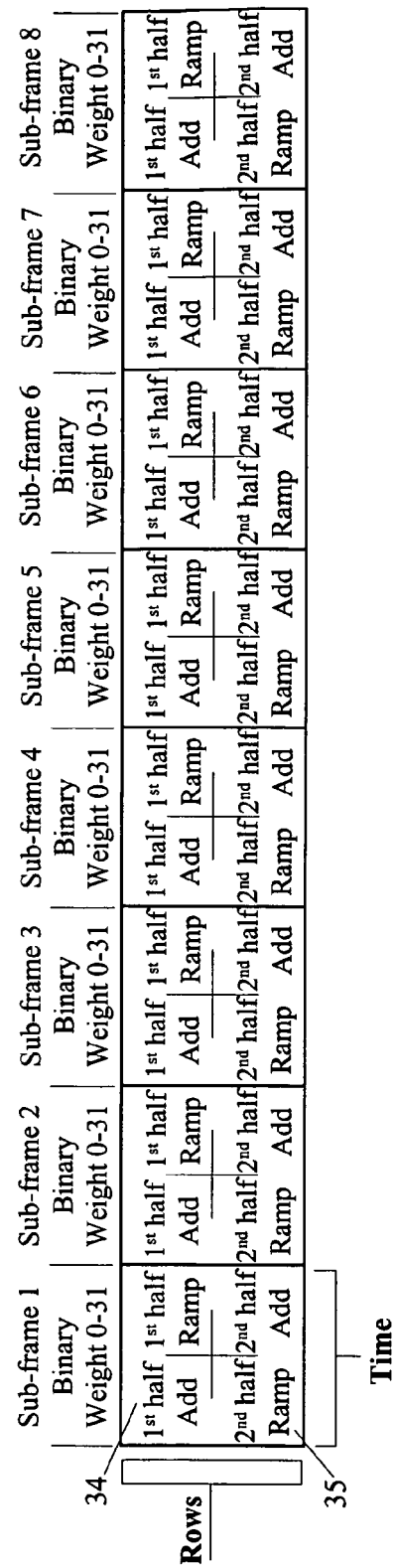
FIG. 9 is a drawing showing the sub-frames for one frame period.
FIG. 10 is a table showing examples of gray scale combinations.

Gray scale is implemented by using the combination of pulse width modulation and sub-frames. Also, the current-source magnitude user control of the OLED Column Driver 25 ICs can be used to adjust white balance and control global brightness of the display. Illustrated in FIG. 9 is a drawing of eight sub-frames in one frame period. Each sub-frame has a binary weight of 32; therefore pulse width modulation is only required to create 32 gray scale levels. By using this combination method, consisting of 8 sub-frames times' 32-pulse width modulation gray scale levels, 256 gray scales per color (16.7 million colors) are produced. Gray scale using this combination method has no abrupt significant difference in gray scale level between sub-frames. Therefore, no motional artifacts are created.

Shown in FIG. 9 is the sequence of events in each sub-frame for an ADT scheme. The display is divided into two halves wherein while one half is in an address period 34 the other half is producing light in the light emission period 35. In this example there are eight sub-frames, each having a gray scale binary weight of 32. It should be understood that other combinations of pulse width modulation and sub-frames are possible when generating gray scales.

Examples shown in the table of FIG. 10 are of three frames of this gray scale method. In the frame of the first example 36 the eight sub-frames is split into two groups. The first group is six sub-frames, each having a pulse width modulation with a binary weight of 31 for a combined gray scale of 186. The second group is two sub-frames each having a pulse width modulation with a binary weight of 32 for a combined gray scale of 64. This results in a total gray scale for this frame of 250. To be noted, between the two sub-frame groups, the maximum difference in pulse width modulation level is one. Therefore, by not having any abrupt significant difference in binary weight between sub-frames, no motional artifacts are generated.

Figure 11:
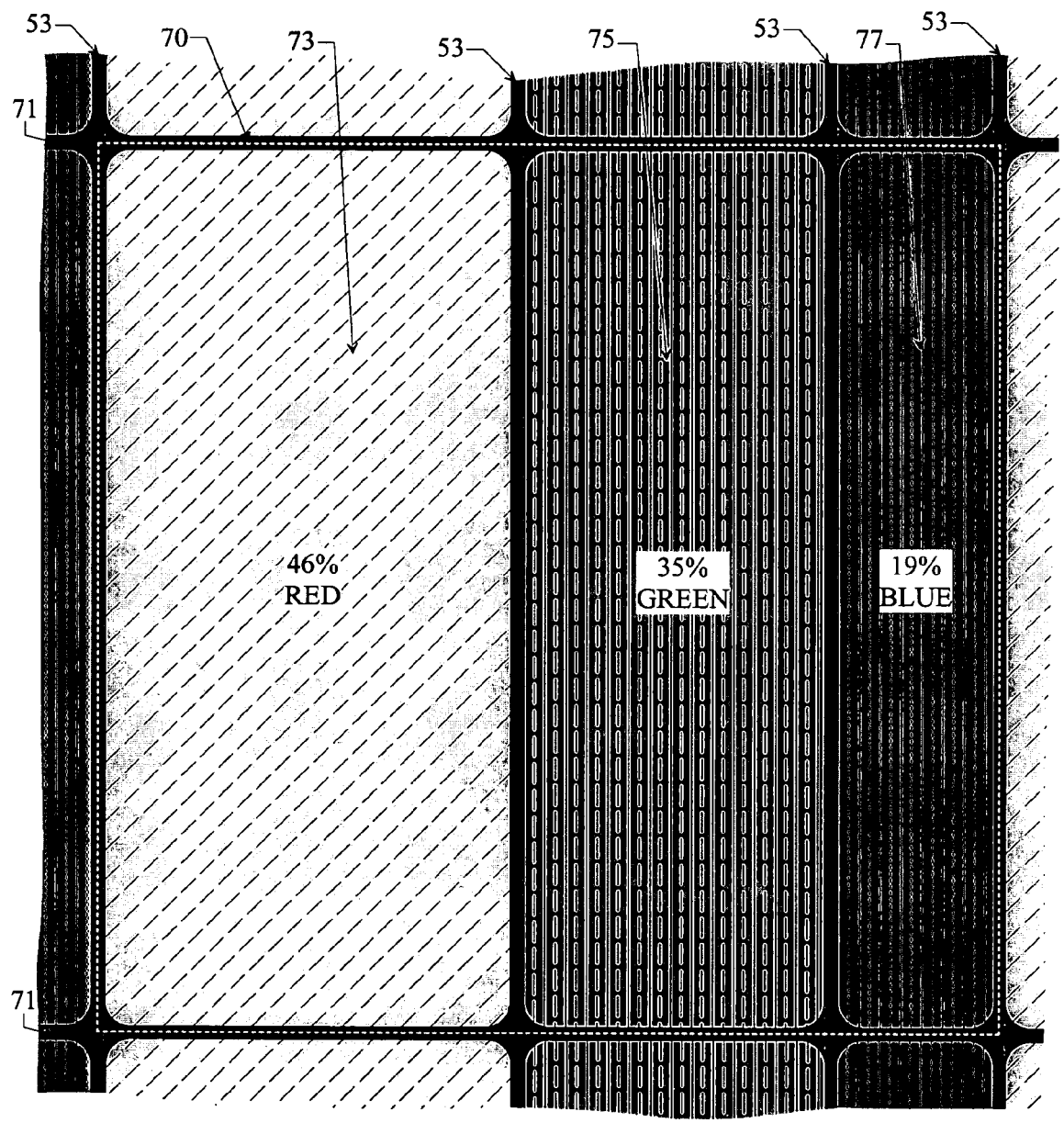
FIG. 11 is a drawing showing a pixel front view with sub-pixel percentages.

Pixel white balance is accomplished by using different sub-pixel sizes for Red, Green, and Blue. Also, OLED Column Driver 25 ICs that support three-each interleaved column current magnitude settings and three precharge voltages A, B, and C mapped to Red, Green, and Blue. The amounts of the three primaries needed to match the color are proportional to r, g, and b. Proportional sub-pixel size is based upon the required amount of luminance for each primary color and the luminance efficiency of each color. For example for a total white luminous of 200.00 cd/m² the amounts of three primaries needed to match color are: Red=71.57 cd/m2; Green=100.00 cd/m2; Blue=28.43 cd/m². If the luminance efficiency of the three primary OLED colors are: Red=11 cd/A; Green=21 cd/A; Blue=12 cd/A, then as illustrated in FIG. 11 a pixel (white dotted square) 70 would be 46% Red 73, 35% Green 75 and 19% Blue 77. It should be noted that these sub-pixel size ratios might vary for different color temperatures and/or changes in luminous efficiency of the three primary colors. Also, the three precharge voltages A, B, and C can be different, which would result in other percentages for the pixel's r, g, and b areas.

In FIG. 11, is shown a front view of the display device pixel (white dotted square) 70, that illustrates very high aperture ratios (greater than 90%). This is possible because all active drive electronics are positioned behind the front emission OLED layers. The only area of the pixel not emitting light is the partitioning walls (banks) 53 and separation between pixels 71.

Several different structures for this display device are proposed. Referring now particularly to FIGS. 12A-12E, there are depicted structure edge views representing different stages in the process of forming a display device 10 having a cathode front structure with the rectification diode on the bottom side of the substrate. Shown in FIG. 12A, the base support is a substrate 41 of a plastic material, such as a metallocen-based cyclic olefin copolymer (mCOC). This plastic's unique ability to withstand temperatures as high as 300° Celsius makes it an ideal candidate to replace glass as the substrate. Estimates are mCOC is about 30 percent cheaper than polycarbonate (PC) when produced in volume. It's also less dense and absorbs 20 times less water than PC and it is 10 times stronger than glass at half the thickness. As illustrated in FIG. 12A, a flexible circuit consisting of a plastic substrate 41 with plated through holes 39 which connects the rectification diode metal electrodes 37 to memory capacitor first electrodes 44. The rectification diode metal electrode 37 is formed in the shape necessary for connecting to the rectification diode 56. The capacitor first electrode 44 is formed into the shape of a sub-pixel.

In FIG. 12B, the rectification diode 56 and column electrode 47 have been added to the structure. This being a cathode front structure the direction and electrical connection for the p-n junction rectification diode 56 is anode 45 electrically connected to the column electrode 47 and the cathode 46 electrically connected to rectification diode metal electrode 37. Column electrodes 47 are formed on the plastic substrate 41 and rectification diode 56 of each sub-pixel. These electrodes are opaque high conductivity column line patterned electrodes whose electrode losses due to line configured electrode resistance are substantially reduced.

Illustrated in FIG. 12C is the addition of a two-layer capacitor serving as the memory capacitor 4. Different methods can be used to form the thin-film dielectric layers for the memory capacitor 4. The first method is High K Polymers of high K relaxor polymers, which have a high dielectric constant and energy storage capability, when compared to conventional polymer dielectrics. A second method is hydrothermally derived BST thin-films, a dielectric material of nano-sized Barium Titanate and Strontium Titanate powders via an aqueous, low temperature process, which allows binary and tertiary oxide compositions with controlled stoichiometries. The ultra-fine particle size of these ceramic powders makes them ideal for ultra-thin embedded polymer/ceramic capacitors. Both of these thin-film dielectric materials have more than enough energy density to satisfy the memory function required for the organic emitting apparatus 1. Referring now to FIGS. 13B-13C, a side view of the cathode front with rectification diode on the bottom of the plastic substrate, for the explanation of the construction of the memory capacitor 4. Illustrated in FIG. 13B, a resist 49 is deposited and patterned on the edge of the capacitor first electrode 44. This is done so that an electrical connection, in a later process step, can be made to this electrode. Next the thin-film dielectric layer 43 is coated over the entire surface. Row electrodes 42 are then formed on the thin-film dielectric layer 43. Opaque high conductivity row line patterned electrode losses, due to line configured electrode resistance are substantially reduced. In addition these electrodes are made thick enough to minimize the voltage drop during line scan addressing of the display device. A second thin-film dielectric layer 55 is then formed to cover the row electrode 42. The resist 49 is remove exposing the edge of the capacitor first electrode 44. Shown in FIG. 13C a capacitor second electrode 50 which has the dual purpose of capacitor second electrode and light emitting diode 2 anode electrode is deposited at a certain angle, such that electrical contact is made with the edge of the capacitor first electrode 44. This capacitor second electrode 50 is then patterned into the shape of a sub-pixel. A second method by which the electrical connection between capacitor first electrode 44 and capacitor second electrode 50 can be made is using via contact holes (not shown).

Now referring back to FIG. 12D a stack of layers consisting of capacitor second electrode 50, a transparent layer 51 and a thin metal layer 52 are deposited at a certain angel, such that electrical contact is made with the edge of capacitor first electrode 44. The stack of layers is formed into a pad in the shape of a sub-pixel. This layered pad has the following functions: (1) Capacitor second electrode for the memory capacitor 4. (2) A destructive-interference contrast-enhancement stack like Luxell's Black Layer™. (3) An anode electrode for the light emitting diode 2. Next, partitioning walls (banks) 53 are formed to fill the spaces between the sub-pixel electrodes. In this way, it is possible to improve the contrast, to prevent mixing of colors of the luminescent materials, and to prevent light from leaking between the sub-pixels.

FIG. 12E illustrates the completed cathode front with the rectifier diode on the substrate bottom structure. The organic luminescent layers are formed in vertical strips of red color 63, green 65 and blue 67. These different color layers are formed by either a deposition method using a metal shadow mask (EP 0 732 868 B1) or by an ink-jet method (EP 1 093 166 A2). The translucent cathode layer 61 covers the entire front surface area of the display device. A buffer layer 62 covers the cathode layer 61. Finally a protective cover 58 is added to the front of the display device and a passivation layer 69, protecting the rectification diodes 56, is added to the back of the display device.

FIGS. 13A-13D, are shown a side view of a cathode front with rectification diode on substrate bottom. To be noted a transparent layer 51 and a thin metal layer 52 are not illustrated in these figures. The translucent cathode layer 61 covers the entire front surface area of the display device. A buffer layer 62 covers the cathode layer 61. Finally a protective cover 58 is added to the front of the display device and a passivation layer 69, protecting the rectification diodes 56, is added to the back of the display device.

Illustrated in FIGS. 14A-14E is the structure for an anode front with rectification diode on substrate bottom. This structure is similar to that of the cathode front with rectification diode on bottom, shown in FIGS. 12A-12E. One difference is the rectification diode 56 direction is reversed. The cathode 46 of the p-n junction diode is electrically connected to the column electrode 47 and the anode 45 is electrically connected to the diode metal electrode 37. A second difference is the light emitting diodes 12 direction is reversed. The light emitting diode anodes are to the front of the display.

Referring to FIG. 14D a stack of layers consisting of capacitor second electrode 50, a transparent layer 51 and a thin metal layer 52 are deposited at a certain angel, such that electrical contact is made with the edge of capacitor first electrode 44. The stack of layers is formed into a pad in the shape of a sub-pixel. This layered pad has the following functions: (1) Capacitor second electrode for the memory capacitor 4. (2) A destructive-interference contrast-enhancement stack like Luxell's Black Layer™. (3) The cathode electrodes 52 for the light emitting diodes 2. Next, partitioning walls (banks) 53 are formed to fill the spaces between the sub-pixel electrodes. In this way, it is possible to improve the contrast, to prevent mixing of colors of the luminescent materials, and to prevent light from leaking between the sub-pixels. The thin metal electrode 52 is the cathode electrode for the light emitting diode 2.

In FIG. 14E, vertical strips of red organic luminescent layers 63, green organic luminescent layers 65 and blue organic luminescent layers 67 are formed. These different color layers are formed by either a deposition method using a metal shadow mask (EP 0 732 868 B1) or by an ink-jet method (EP 1 093 166 A2).

The light emitting diode anode electrode 61 is a layer of ITO that covers the entire front surface of the display device. Finally a protective cover 58 is added to the front of the display and a passivation layer 69, protecting the rectification diodes 56, is added to the back of the display device.

Referring now particularly to FIGS. 15A-15D, there are depicted structure edge views representing different stages in the process of forming a display device 10 having a cathode front structure with the column electrode on the substrate. In FIG. 15A, the base support is a substrate 41 of a plastic material, such as a metallocen-based cyclic olefin copolymer (mCOC). This plastic's unique ability to withstand temperatures as high as 300° Celsius makes it an ideal candidate to replace glass as the substrate. Estimates are mCOC is about 30 percent cheaper than polycarbonate (PC) when produced in volume. It's also less dense and absorbs 20 times less water than PC and it is 10 times stronger than glass at half the thickness.

Column electrodes 47 are formed on the plastic substrate by deposition of a metal. This metal is patterned into vertical stripe column electrodes 47. These electrodes have an additional purpose of being the anode electrode for the rectification diode 56 of each sub-pixel. These electrodes are opaque high conductivity column line patterned electrodes whose electrode losses due to line configured electrode resistance are substantially reduced.

The interlayer insulating film 48 that has been deposited so as to be thicker than a necessary thickness is subjected to a planarization step (particularly by mechanical polishing). The interlayer insulating film 48 polishing step will play an important role in forming the memory capacitor and the organic light emitting diode electrodes later. As illustrated in FIG. 15A, the broken line 40 represents the shape of the interlayer insulating film 48 before being subjected to the polishing step and indicates that surface asperities of the interlayer insulating film 48 are removed, i.e., the surface is planarized, by the mechanical polishing step.

A metal is deposited on the interlayer insulating film 48 and then etched to conform to the shape of a sub-pixel pad. This first capacitor electrode 44 pad of each sub-pixel, as shown in FIG. 15B, has the dual purpose of connection to the p-n junction diode cathode 46 of the rectification diode 56 and as the capacitor first electrode 44 for the memory capacitor 4.

Illustrated in FIG. 15B is the addition of a two-layer capacitor serving as memory capacitor 4. Different methods can be used to form the thin-film dielectric layers for memory capacitor 4. The first method is High K Polymers of high K relaxor polymers, which have a high dielectric constant and energy storage capability, when compared to conventional polymer dielectrics. A second method is hydrothermally derived BST thin-films a dielectric material of nano-sized Barium Titanate and Strontium Titantate powders via an aqueous, low temperature process, which allows binary and tertiary oxide compositions with controlled stoichiometries. The ultra-fine particle size of these ceramic powders makes them ideal for ultra-thin embedded polymer/ceramic capacitors. Both of these thin-film dielectric materials have more than enough energy density to satisfy the memory function required for the organic emitting apparatus 1.

Referring now to FIGS. 16B-16C, for the explanation of the construction of memory capacitor 4, is shown a side view of the cathode front with column electrodes on the substrate. Illustrated in FIG. 16B, a resist 49 is deposited and patterned on the edge of the capacitor first electrode 44. This is done so that an electrical connection, in a later process step, can be made to this electrode. Next the thin-film dielectric layer 43 is coated over the entire surface. Row electrodes 42 are then formed on the thin-film dielectric layer 43. Opaque high conductivity row line patterned electrode losses, due to line configured electrode resistance are substantially reduced. In addition these electrodes are made thick enough to minimize the voltage drop during line scan addressing of the display device. A second thin-film dielectric layer 55 is then formed to cover the row electrode 42. The resist 49 is remove exposing the edge of the capacitor first electrode 44. Shown in FIG. 16C a capacitor second electrode 50 which has the dual purpose of capacitor second electrode and light emitting diode anode electrode is deposited at a certain angle, such that electrical contact is made with the edge of the capacitor first electrode 44. This capacitor second electrode 50 is then patterned into the shape of a sub-pixel. A second electrical connection method between capacitor first electrode 44 and capacitor second electrode 50 is via contact holes (not shown).

FIG. 15D illustrates the completed cathode front with column electrode on the substrate. The organic luminescent layers are formed in vertical strips of red color 63, green color 65 and blue color 67. These different color layers are formed by either a deposition method using a metal shadow mask (EP 0 732 868 B1) or by an ink-jet method (EP 1 093 166 A2). The translucent cathode layer 61 covers the entire front surface area of the display device. A buffer layer 62 covers the cathode layer 61. Finally a protective cover 58 is added to the front of the display device.

FIGS. 16A-16D, are shown a side view of a cathode front with rectification diode on substrate bottom Referring now particularly to FIGS. 17A-17D, there are depicted structure edge views representing different stages in the process of forming a display device 10 having an anode front structure with the column electrode on the substrate. In FIG. 17A, the base support is a substrate 41 of a plastic material, such as a metallocen-based cyclic olefin copolymer (mCOC). This plastic's unique ability to withstand temperatures as high as 300° Celsius makes it an ideal candidate to replace glass as the substrate. Estimates are mCOC is about 30 percent cheaper than polycarbonate (PC) when produced in volume. It's also less dense and absorbs 20 times less water than PC and it is 10 times stronger than glass at half the thickness.

Column electrodes 47 are formed on the plastic substrate by deposition of a metal. This metal is patterned into vertical stripe column electrodes 47. These electrodes have an additional purpose of being the cathode electrode 46 for the rectification diode 56 of each sub-pixel. These electrodes are opaque high conductivity column line patterned electrodes whose electrode losses due to line configured electrode resistance are substantially reduced.

The interlayer insulating film 48 that has been deposited so as to be thicker than a necessary thickness is subjected to a planarization step (particularly by mechanical polishing). The interlayer insulating film 48 polishing step will play an important role in forming the memory capacitor and the organic light emitting diode electrodes later. In As illustrated in FIG. 15A, the broken line 40 represents the shape of the interlayer insulating film 48 before being subjected to the polishing step and indicates that surface asperities of the interlayer insulating film 48 are removed, i.e., the surface is planarized, by the mechanical polishing step.

A metal is deposited on the interlayer insulating film 48 and then etched to conform to the shape of a sub-pixel pad. This first capacitor electrode 44 pad of each sub-pixel, as shown in FIG. 17B, has the dual purpose of connection to the p-n junction diode anode 45 of the rectification diode 56 and as the capacitor first electrode 44 for the memory capacitor 14.

Illustrated in FIG. 17B and FIG. 17C is the addition of a two-layer capacitor serving as memory capacitor 4. The memory capacitor 4 structure is comprised of capacitor first electrode 44, a first dielectric layer 43, the row electrode 42, a second dielectric layer 55 and the capacitor second electrode 50.

Referring to FIG. 17C a stack of layers consisting of capacitor second electrode 50, a transparent layer 51 and a thin metal layer 52 are deposited at a certain angel, such that electrical contact is made with the edge of capacitor first electrode 44. The stack of layers is formed into a pad in the shape of a sub-pixel. This layered pad has the following functions: (1) Capacitor second electrode for the memory capacitor 14. (2) A destructive-interference contrast-enhancement stack like Luxell's Black Layer™. (3) The cathode electrodes 52 for the light emitting diodes 2. Next, partitioning walls (banks) 53 are formed to fill the spaces between the sub-pixel electrodes. In this way, it is possible to improve the contrast, to prevent mixing of colors of the luminescent materials, and to prevent light from leaking between the sub-pixels. The thin metal electrode 52 is the cathode electrode for the light emitting diode 2.

In FIG. 17D, vertical strips of red organic luminescent layers 64, green organic luminescent layers 66 and blue organic luminescent layers 68 are formed. These different color layers are formed by either a deposition method using a metal shadow mask (EP 0 732 868 B1) or by an ink-jet method (EP 1 093 166 A2).

The light emitting diode anode electrode 54 is a layer of ITO that covers the entire front surface of the display device. Finally a protective cover 58 is added to the front of the display.

Another structure, illustrated in FIGS. 18A-18D, is of the cathode front with row electrode on substrate and a blocking diode in series with the OLED. In this structure the row electrode 42 is formed first on the substrate 41, then the entire surface is coated with a thin-film dielectric layer 43. A metal is deposited on the dielectric and then etched to conform to the shape of a sub-pixel pad forming the capacitor electrode 79 in each sub-pixel to complete the memory capacitor 4.

Shown in FIG. 18B is the rectification diode 56, which is formed on the capacitor electrode 79. The p-n junction diode anode 45 is connected to the column electrode 47 and the cathode 46 is connected to the capacitor electrode 79.

The capacitor electrode 79 and the column electrode 47 are then covered with an interlayer insulating film 48, to electrically insulate them from the organic light emitting diode electrodes that will be formed later. To reduce electrode capacitance it may be necessary to have a thicker layer of insulating film between the column electrode 47 and the capacitor electrode 79. This will require via contact holes (not shown) between the column electrode 47 and the rectification diode 56.

The interlayer insulating film 48, that has been deposited so as to be thicker than a necessary thickness, is subjected to a planarization step (particularly by mechanical polishing). The interlayer insulating film 48 polishing step will play an important role in forming organic light emitting diode electrodes later. Illustrated in FIG. 18B, the broken line 40 represents the shape of the interlayer insulating film 48 before being subjected to the polishing step and indicates that surface asperities of the interlayer insulating film 48 are removed, i.e., the surface is planarized, by the mechanical polishing step.

As shown in FIG. 18C, a light emitting diode anode electrode 60 having a pad shaped like the sub-pixel is formed on the interlayer insulating film 48 and is connected to the capacitor electrode 79 via contact holes 59. Next, partitioning walls (banks) 53 are formed to fill the spaces between the sub-pixel electrodes. In this way, it is possible to improve the contrast, to prevent mixing of colors of the luminescent materials, and to prevent light from leaking between the sub-pixels.

Further, organic luminescent layers are formed respectively on the sub-pixel electrodes according to a predetermined pattern. In this case, it is preferable to provide organic luminescent layers with three-color types. FIG. 18D illustrates the completed cathode front with the row electrode on the substrate structure. The organic luminescent layers are vertical strips of red color 63, green 65 and blue 67. These different color layers are formed by either a deposition method using a metal shadow mask (EP 0 732 868 B1) or by an ink-jet method (EP 1 093 166 A2).

The translucent cathode layer 61 covers the entire front surface area of the display device. A buffer layer 62 covers the cathode layer 61. Finally a protective cover 58 is added to the front of the display device.

FIGS. 19A-19D, illustrates the structure of an anode front with row electrode on substrate. The structure and processes for FIG. 19A are the same as those for FIG. 18A. In FIG. 19B, the rectification diode 56 direction is such that the doped p-type 45 is connected to the capacitor electrode 79 and the doped n-type 46 is connected to the column electrode 47. The capacitor electrode 79 and the column electrode 47 are covered with an interlayer insulating film 48 for electrically insulating them from the organic light emitting diode electrodes that will be formed later. To reduce electrode capacitance it may be necessary to have a thicker layer of insulating film between the column electrode 47 and the capacitor electrode 79. Doing this will require via contact holes (not shown) between the column electrode 47 and rectification diode 56 surface.

The light emitting diode cathode electrode 50 having a pad shaped like the sub-pixel is formed on the interlayer insulating film 48 and is connected to the capacitor electrode 79 via contact holes 49. As shown in FIG. 19C an optical interference member (WO 01/08240 A1) is comprised of a semi-absorbent layer 52 and a transparent layer 51. These two layers have the same shape as the light emitting diode cathode electrode 50. The optical interference member reduces the overall reflectance from the device.

Further, organic luminescent layers are formed respectively on the sub-pixel electrodes according to a predetermined pattern. In this case, it is preferable to provide organic luminescent layers with three-color types. Illustrated in FIG. 19D, are vertical strips of red organic luminescent layers 64, green organic luminescent layers 66 and blue organic luminescent layers 68. These different color layers are formed by either a deposition method using a metal shadow mask (EP 0 732 868 B1) or by an ink-jet method (EP 1 093 166 A2).

The anode electrode 54 is a layer of ITO that covers the entire front surface of the display device. Finally a protective cover 58 is added to the front of the display.

FIG. 20 shows a cathode front structure electrical equivalent circuit for driving an organic emitting apparatus 201 comprised of at least one light emitting diode 202 with blocking diode 207 in series to it, rectification diode 203 and a memory capacitor 204 which serves as a memory device. The cathode of the organic light emitting diode 202 is to the front of the display. The OLED cathode electrode 61 covers the entire face of the display device and is connected to $V_{OFFSET}$. Current mode data programming is the same as illustrated in FIG. 3A except that blocking diode 207 is now in series to the light emitting diode 202 blocking a reverse bias voltage across the light emitting diode 202. This eliminates the power loss due to charging the capacitance of the light emitting diode 202 when a reverse bias voltage is applied across the light emitting diode 202. Also, a voltage limit due to the maximum reverse bias withstanding voltage of the light emitting diode 202 is removed. Therefore, the memory capacitor 204 can be charged to a higher voltage without concern for the maximum reverse bias voltage of the light emitting diode 202. The advantages of being able to apply higher voltages to the memory capacitor 204 are an increase in charge stored in the memory capacitor 204, resulting in higher display brightness capability or being able to reduce the size of the memory capacitor 204 and still store the same amount of charge by being able to use a higher voltage, resulting in the same display brightness.

FIG. 21 shows an anode front structure electrical equivalent circuit for driving an organic emitting apparatus 211 comprised of at least one light emitting diode 212 with blocking diode 217 in series to it, rectification diode 213 and a memory capacitor 214 which serves as a memory device. The anode of the organic light emitting diode 212 is to the front of the display. The OLED anode electrode 54 covers the entire face of the display device and is connected to $V_{OFFSET}$. Current mode data programming is the same as illustrated in FIG. 4A except that blocking diode 217 is now in series to the light emitting diode 212 blocking a reverse bias voltage across the light emitting diode 212. This eliminates the power loss due to charging the capacitance of the light emitting diode 212 when a reverse bias voltage is applied across the light emitting diode 212. Also, a voltage limit due to the maximum reverse bias withstanding voltage of the light emitting diode 212 is removed. Therefore, the memory capacitor 214 can be charged to a higher voltage without concern for the maximum reverse bias voltage of the light emitting diode 212. The advantages of being able to apply higher voltages to the memory capacitor 214 are an increase in charge stored in the memory capacitor 214, resulting in higher display brightness capability or being able to reduce the size of the memory capacitor 214 and still store the same amount of charge by being able to use a higher voltage, resulting in the same display brightness.

Another structure, illustrated in FIGS. 22A-22D, is of the cathode front with row electrode on substrate and blocking diode 85 blocking reverse voltage to the OLED. In this structure the row electrode 42 is formed first on the substrate 41, then the entire surface is coated with a thin-film dielectric layer 43. A metal is deposited on the dielectric and then etched to conform to the shape of a sub-pixel pad forming the capacitor electrode 79 in each sub-pixel to complete the memory capacitor 204.

Figures 22A, 22B, 22C, 22D:
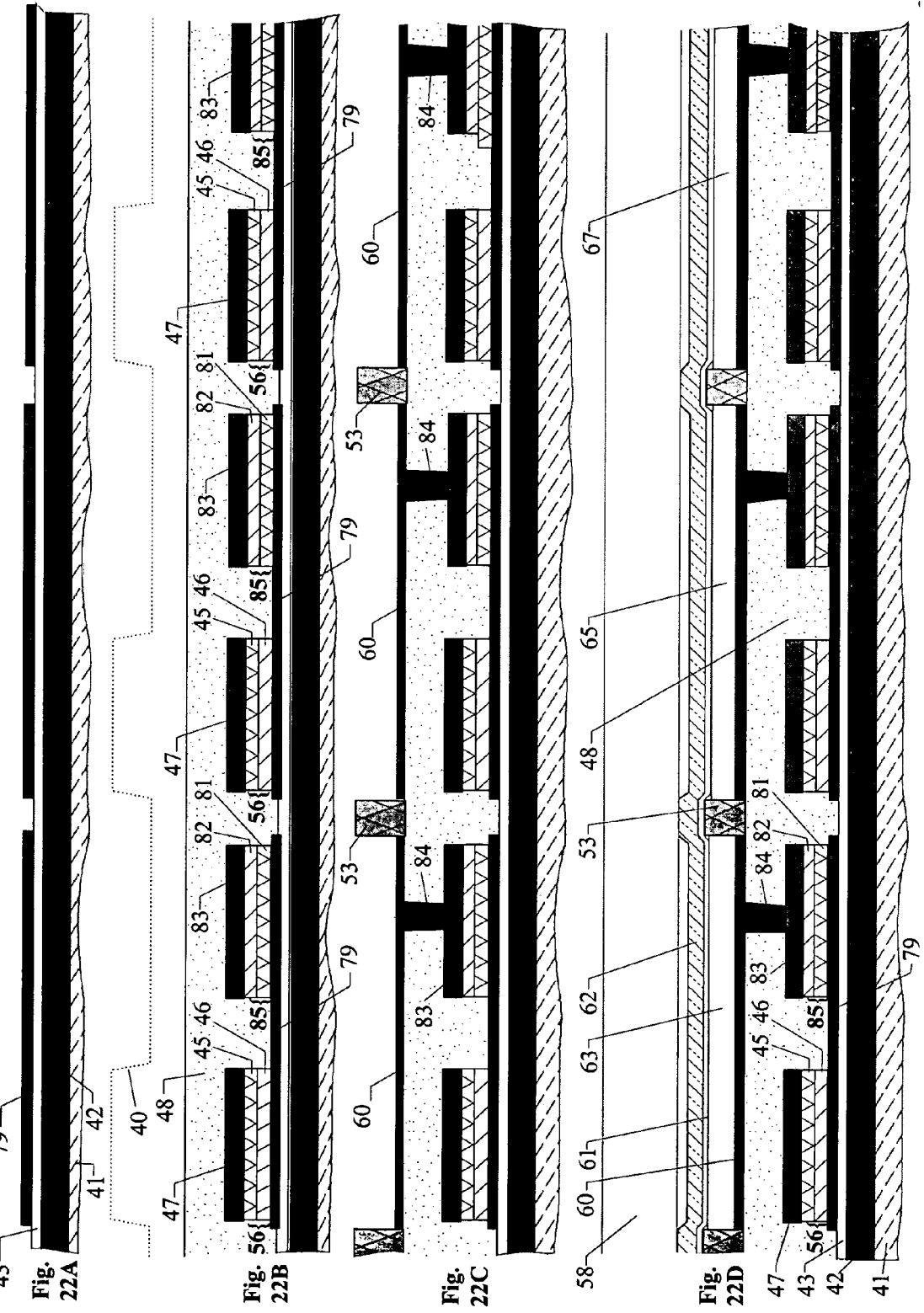
FIGS. 22A through 22D is a cathode front structure with a blocking diode in series to the OLED.

Shown in FIG. 22B is the rectification diode 56, which is formed on the capacitor electrode 79. The p-n junction diode's anode 45 is connected to the column electrode 47 and the cathode 46 is connected to the capacitor electrode 79. Blocking diode 85 is also formed on the capacitor electrode 79. Its p-n junction diode's anode 81 is connected to the capacitor electrode 79 and the cathode 82 is connected to blocking diode electrode 83.

The capacitor electrode 79, the column electrode 47 and blocking diode electrode 83 are then covered with an interlayer insulating film 48, to electrically insulate them from the organic light emitting diode electrodes that will be formed later.

The interlayer insulating film 48, that has been deposited so as to be thicker than a necessary thickness, is subjected to a planarization step (particularly by mechanical polishing). The interlayer insulating film 48 polishing step will play an important role in forming organic light emitting diode electrodes later. Illustrated in FIG. 22B, the broken line 40 represents the shape of the interlayer insulating film 48 before being subjected to the polishing step and indicates that surface asperities of the interlayer insulating film 48 are removed, i.e., the surface is planarized, by the mechanical polishing step.

As shown in FIG. 22C, a light emitting diode anode electrode 60 having a pad shaped like the sub-pixel is formed on the interlayer insulating film 48 and is connected to the blocking diode electrode 83 via contact holes 84. Next, partitioning walls (banks) 53 are formed to fill the spaces between the sub-pixel electrodes. In this way, it is possible to improve the contrast, to prevent mixing of colors of the luminescent materials, and to prevent light from leaking between the sub-pixels.

Further, organic luminescent layers are formed respectively on the sub-pixel electrodes according to a predetermined pattern. In this case, it is preferable to provide organic luminescent layers with three-color types. FIG. 22D illustrates the completed cathode front structure with blocking diode in series to the OLED. The organic luminescent layers are vertical strips of red color 63, green 65 and blue 67. These different color layers are formed by either a deposition method using a metal shadow mask (EP 0 732 868 B1) or by an ink-jet method (EP 1 093 166 A2).

The translucent cathode layer 61 covers the entire front surface area of the display device. A buffer layer 62 covers the cathode layer 61. Finally a protective cover 58 is added to the front of the display device.

FIGS. 23A-23D, illustrates the structure of an anode front with row electrode on substrate and a blocking diode in series with the OLED. The structure and processes for FIG. 23A are the same as those for FIG. 22A. In FIG. 23B, the rectification diode 56 direction is such that the doped p-type 45 is connected to the capacitor electrode 79 and the doped n-type 46 is connected to the column electrode 47. The blocking diode 85 direction is such that the doped p-type 81 is connected to blocking diode electrode 83 and the doped n-type 82 is connected to the capacitor electrode 79. The capacitor electrode 79, column electrode 47 and blocking diode electrode 83 are covered with an interlayer insulating film 48 for electrically insulating them from the organic light emitting diode electrodes that will be formed later.

The light emitting diode cathode electrode 80 having a pad shaped like the sub-pixel is formed on the interlayer insulating film 48 and is connected to the blocking diode electrode 83 via contact holes 84. As shown in FIG. 23C an optical interference member (WO 01/08240 A1) is comprised of a semi-absorbent layer 52 and a transparent layer 51. These two layers have the same shape as the light emitting diode cathode electrode 80. The optical interference member reduces the overall reflectance from the device.

Further, organic luminescent layers are formed respectively on the sub-pixel electrodes according to a predetermined pattern. In this case, it is preferable to provide organic luminescent layers with three-color types. Illustrated in FIG. 23D, are vertical strips of red organic luminescent layers 64, green organic luminescent layers 66 and blue organic luminescent layers 68. These different color layers are formed by either a deposition method using a metal shadow mask (EP 0 732 868 B1) or by an ink-jet method (EP 1 093 166 A2).

The anode electrode 54 is a layer of ITO that covers the entire front surface of the display device. Finally a protective cover 58 is added to the front of the display.

What is claimed is:

1. In an organic light-emitting diode driving system comprising a matrix of elements arrayed in a plurality of rows and columns, wherein each element is comprised of an organic LED, a rectifier diode and a capacitor electrically connected,
   the improvement wherein there is a blocking diode in series with each organic light-emitting diode, and wherein there are metal row electrodes electrically connected to each element's capacitor; metal column electrodes electrically connected to each element's rectifier diode; current mode data programming column driver ICs; row driver ICs; and a transparent front electrode electrically connected to each element's organic LED.

2. The invention of claim 1 wherein a ramp voltage is applied to said light-emitting apparatus for causing the discharge of said capacitor through said light-emitting diode so as to produce light.

3. The invention of claim 1 wherein pulse width modulation is used for controlling the charge on said capacitor during the addressing period.

4. The invention of claim 1 wherein said capacitor is charged during an addressing period with pulse width modulation.

5. In an organic light-emitting diode driving system comprising a matrix of elements arrayed in a plurality of rows and columns, wherein each element is comprised of an organic LED, a rectifier diode and a capacitor electrically connected, the improvement wherein there is a blocking diode in series with each organic light-emitting diode, to block a reverse bias voltage across the light-emitting diode, and wherein there are metal row electrodes electrically connected to each element's capacitor; metal column electrodes electrically connected to each element's rectifier diode; current mode data programming column driver ICs; row driver ICs; and a transparent front electrode electrically connected to each element's organic LED.

6. The invention of claim 5 wherein a ramp voltage is applied to said light-emitting apparatus for causing the discharge of said capacitor through said light-emitting diode so as to produce light.

7. The invention of claim 5 wherein pulse width modulation is used for controlling the charge on said capacitor during the addressing period.

8. The invention of claim 5 wherein said capacitor is charged during an addressing period with pulse width modulation.

* * * * *